(12) United States Patent
Lien et al.

(10) Patent No.: US 11,600,343 B2
(45) Date of Patent: Mar. 7, 2023

(54) EFFICIENT READ OF NAND WITH READ DISTURB MITIGATION

(71) Applicant: SanDisk Technologies LLC, Addison, TX (US)

(72) Inventors: Yu-Chung Lien, San Jose, CA (US); Tomer Eliash, Sunnyvale, CA (US); Huai-Yuan Tseng, San Ramon, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/329,390

(22) Filed: May 25, 2021

(65) Prior Publication Data

US 2022/0383961 A1    Dec. 1, 2022

(51) Int. Cl.
| | | |
|---|---|---|
| *G11C 16/04* | (2006.01) | |
| *G11C 16/34* | (2006.01) | |
| *G11C 16/26* | (2006.01) | |
| *G11C 16/08* | (2006.01) | |
| *H01L 27/11582* | (2017.01) | |
| *H01L 27/11565* | (2017.01) | |
| *G11C 11/56* | (2006.01) | |
| *H01L 25/065* | (2023.01) | |

(52) U.S. Cl.
CPC ...... *G11C 16/3427* (2013.01); *G11C 16/0483* (2013.01); *G11C 16/08* (2013.01); *G11C 16/26* (2013.01); *G11C 11/5671* (2013.01); *H01L 25/0657* (2013.01); *H01L 27/11565* (2013.01); *H01L 27/11582* (2013.01); *H01L 2225/06562* (2013.01)

(58) Field of Classification Search
CPC . G11C 16/3427; G11C 16/0483; G11C 16/08; G11C 16/26; G11C 11/5671
USPC .................................................. 365/185.02
See application file for complete search history.

(56) References Cited

U.S. PATENT DOCUMENTS

| | | | |
|---|---|---|---|
| 9,318,210 | B1 | 4/2016 | Hart et al. |
| 9,336,883 | B2 * | 5/2016 | Lee .................. G11C 16/32 |
| 9,361,993 | B1 | 6/2016 | Chen et al. |
| 9,406,391 | B1 | 8/2016 | Chen et al. |
| 9,747,992 | B1 * | 8/2017 | Chen ................. G11C 16/04 |
| 10,026,487 | B2 | 7/2018 | Chen et al. |
| 10,468,111 | B1 | 11/2019 | Yang et al. |
| 10,541,037 | B2 | 1/2020 | Zhao et al. |

(Continued)

*Primary Examiner* — Tha-O H Bui
(74) *Attorney, Agent, or Firm* — Vierra Magen Marcus LLP

(57) ABSTRACT

Technology is disclosed for an efficient read NAND memory cells while mitigating read disturb. In an aspect, a read sequence includes a read spike that removes residual electrons from the NAND channels, followed by reading multiple different groups of memory cells, followed by a channel clean operation. The read spike and channel clean mitigate read disturb. The read spike and channel clean each take a significant amount of time to perform. However, since multiple groups of memory cells are read between the read spike and channel clean this time is essentially spread over the reading of multiple groups, thereby improving the average time to read a single group of memory cells. In one aspect, reading the multiple different groups of memory cells includes reading one or more pages from each of the groups of memory cells. In one aspect, each group is in a different sub-block.

19 Claims, 22 Drawing Sheets

(56) References Cited

U.S. PATENT DOCUMENTS

| | | | |
|---|---|---|---|
| 10,636,501 B1* | 4/2020 | Chen .................. | G11C 11/5628 |
| 10,861,537 B1 | 12/2020 | Lien et al. | |
| 2010/0182844 A1* | 7/2010 | Han .................. | G11C 16/3454 |
| | | | 365/185.25 |

* cited by examiner

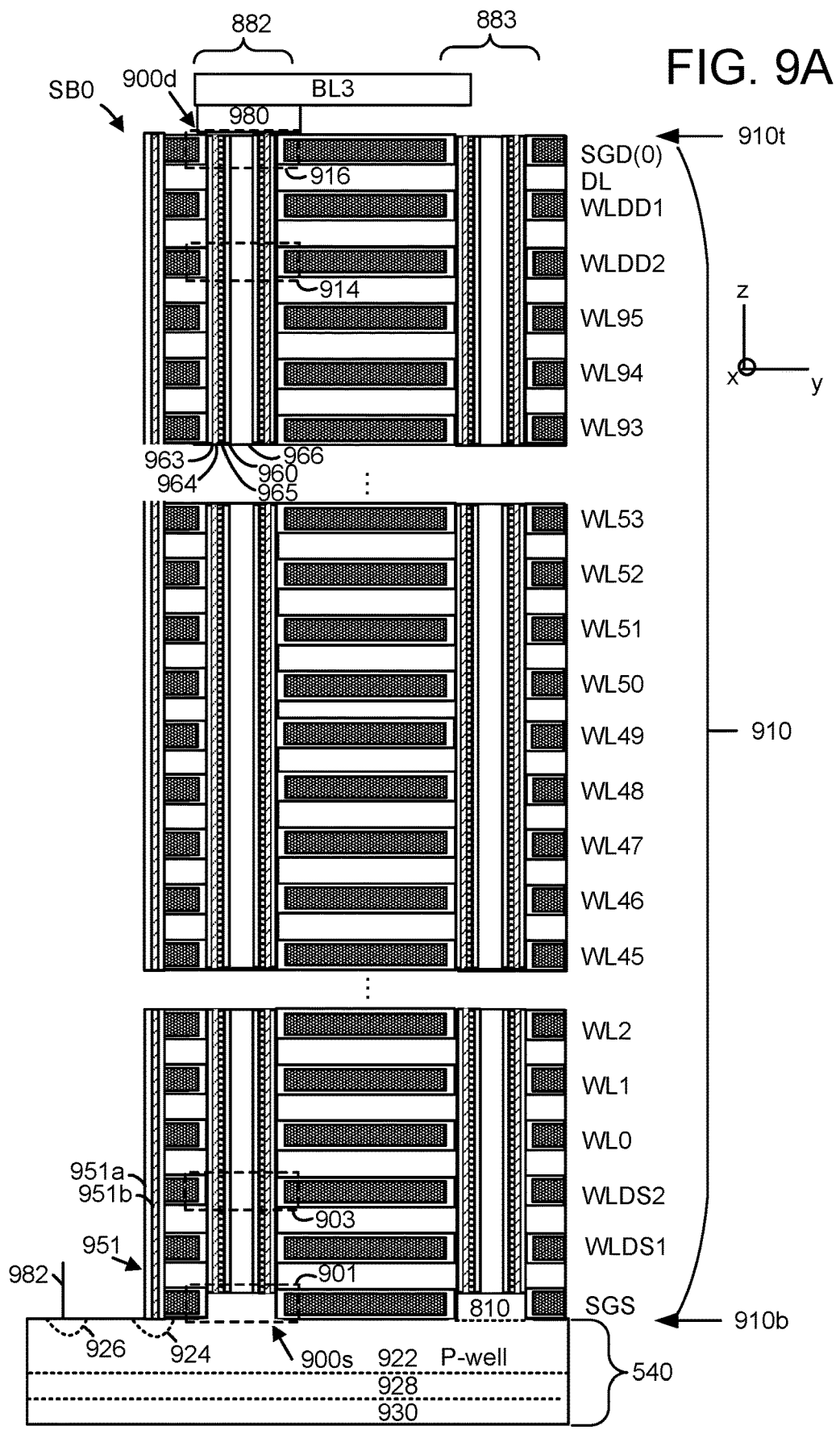

US 11,600,343 B2

EFFICIENT READ OF NAND WITH READ DISTURB MITIGATION

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

In an example, the memory device is a charge-trapping memory device. A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source-side transistors in NAND strings.

In a 3D stacked non-volatile memory device, a read operation can adversely impact the state of memory cells, which is referred to a read disturb. The memory device can be arranged in multiple blocks, where each block includes multiple sub-blocks, and a read operation is performed on a selected sub-block. The different sub-blocks can have the same word line layer, bit line and source line biases, but typically have separate biases for drain-side select gate (SGD) transistors. During the read in the selected sub-block, the SGD transistors of the unselected sub-blocks are typically turned off (made non-conductive) to cut off the conduction paths in unselected strings of the memory cells. In order to read memory cells in one sub-block, a read reference voltage is applied to a selected word line and a read-pass voltage (Vread) of about 7-9 V is typically applied to the unselected word lines. Since the word lines are shared with the other sub-blocks, the unselected word lines in the other sub-blocks are thus biased to the read-pass voltage. Since the SGD transistors of the unselected sub-blocks are typically turned off, the channels of the NAND strings in the unselected sub-blocks will be boosted due to capacitive coupling between the unselected word lines and the NAND channels.

This channel boosting can help reduce the occurrence of normal read disturb for the unselected cells of the unselected NAND strings. Normal read disturb results in an increase in the threshold voltage (Vt) of an unselected cell in a read operation. Normal read disturb is caused by weak Fowler-Nordheim (F-N) tunneling due to a large voltage difference between the control gate and a channel of a cell.

However, when a memory cell is being read with a relatively low voltage (Vwl_sel) on the selected word line, a large voltage gradient can be formed in the channel which results in electron/hole generation. This gradient can be formed between the selected word line and either of the adjacent word lines (e.g., WLsel-1 on the drain-side of WLsel and WLsel-1 on the source-side of WLsel). The generated electrons can be injected into the charge trap layers of the memory cells connected to the adjacent word lines and cause a hot carrier injection (HCI) type of read disturb.

BRIEF DESCRIPTION OF THE DRAWING

Like-numbered elements refer to common components in the different figures.

FIGS. 9A-9B depict cross-sectional views of a portion of a sub-block, each depicting two NAND strings above a substrate.

DETAILED DESCRIPTION

Figure 1A:
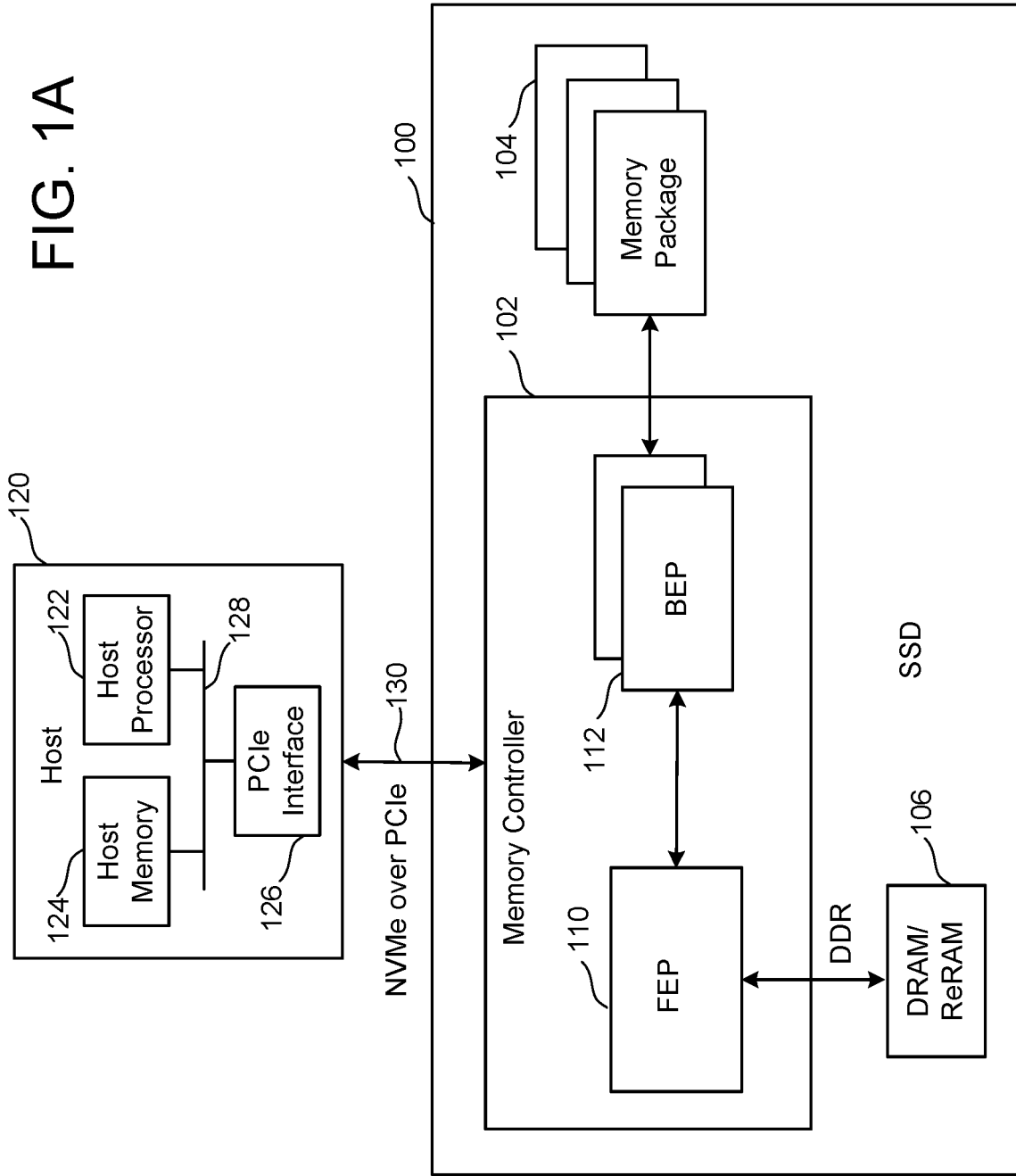
FIG. 1A is a block diagram of one embodiment of a storage system connected to a host.

The technology described herein pertains to reading NAND memory cells in a three-dimensional (3D) memory structure. Techniques disclosed herein reduce read disturb due to for, for example, HCI, with a minimal sacrifice in speed in reading the memory cells. In an embodiment, a read sequence includes a read spike that removes residual electrons from the NAND channels, followed by reading multiple different groups of memory cells, followed by a channel clean operation. The read spike and channel clean reduce or eliminate read disturb due to, for example, HCI. The read spike and channel clean each take a significant amount of time to perform. However, since multiple groups of memory cells are read between the read spike and channel clean this time is essentially spread over the reading of multiple groups, thereby improving the average time to read a single group of memory cells.

In one embodiment, reading the multiple different groups of memory cells includes reading one or more pages from each of the groups of memory cells. In one embodiment, each group is in a different sub-block of a block of memory cells. Each group may be connected to the same word line. The different sub-blocks share the same word lines, but have a different select lines (e.g., drain side select line). Therefore, the different sub-blocks can be independently selected for a read operation.

In one embodiment, the read sequence for reading a page from each group of memory cells includes: a read spike to remove residual electrons from NAND channels in a block of memory cells, reading memory cells in each sub-block at a first read reference voltage at different times, reading memory cells in each sub-block at a second read reference voltage at different times (followed by reading memory cells in each sub-block at any additional read reference voltages until the memory cells have been sensed for all the read reference voltages for the page), followed by a channel clean. In one embodiment, the channel clean includes raising the voltage on the selected word line to a read pass voltage and then lowering all of the word lines from the read pass voltage to a steady state voltage in unison.

As one example, the total time spent on the read spike and channel clean could be about 24 micro-seconds (μs). If a group of memory cells stores three pages, the time to read each page could be about 50 μs, 65 μs, and 50 μs, respectively. The reason for the different times to read the pages is that there may be more read reference voltages for some pages. Were just one group of memory cells read between a read spike and channel clean, the total time could be about: 24+50+65+50=189 μs. However, if four groups of memory cells are read between the read spike and channel clean, the total time could be: 24+165+165+165+165=684 μs, which is an average of just 171 μs per group. The foregoing read times are examples, and could be lower or higher. The average read time is reduced while still reducing or preventing read disturb due to, for example, HCI.

FIG. 1A-FIG. 9B describe one example of a storage system that can be used to implement the technology disclosed herein.

FIG. 1A is a block diagram of one embodiment of a storage system 100 connected to a host system 120. Storage system 100 can implement the technology disclosed herein. Many different types of storage systems can be used with the technology disclosed herein. One example storage system is a solid-state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more memory dies. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory, or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
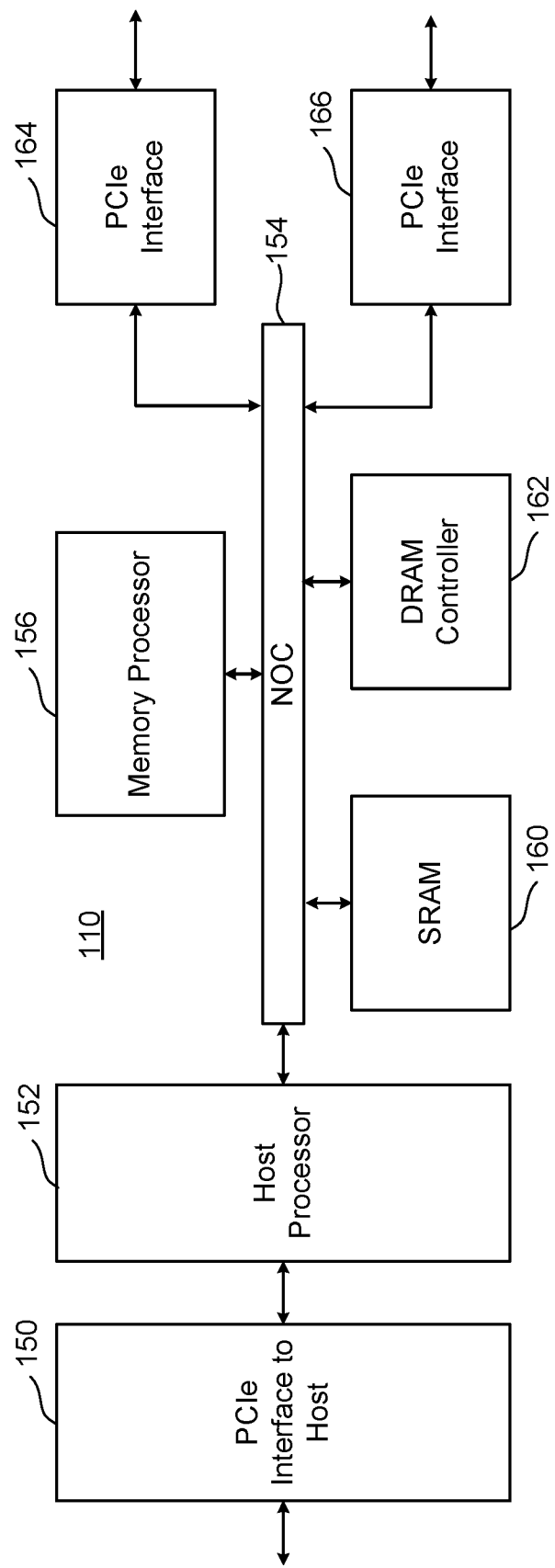
FIG. 1B is a block diagram of one embodiment of a Front-End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
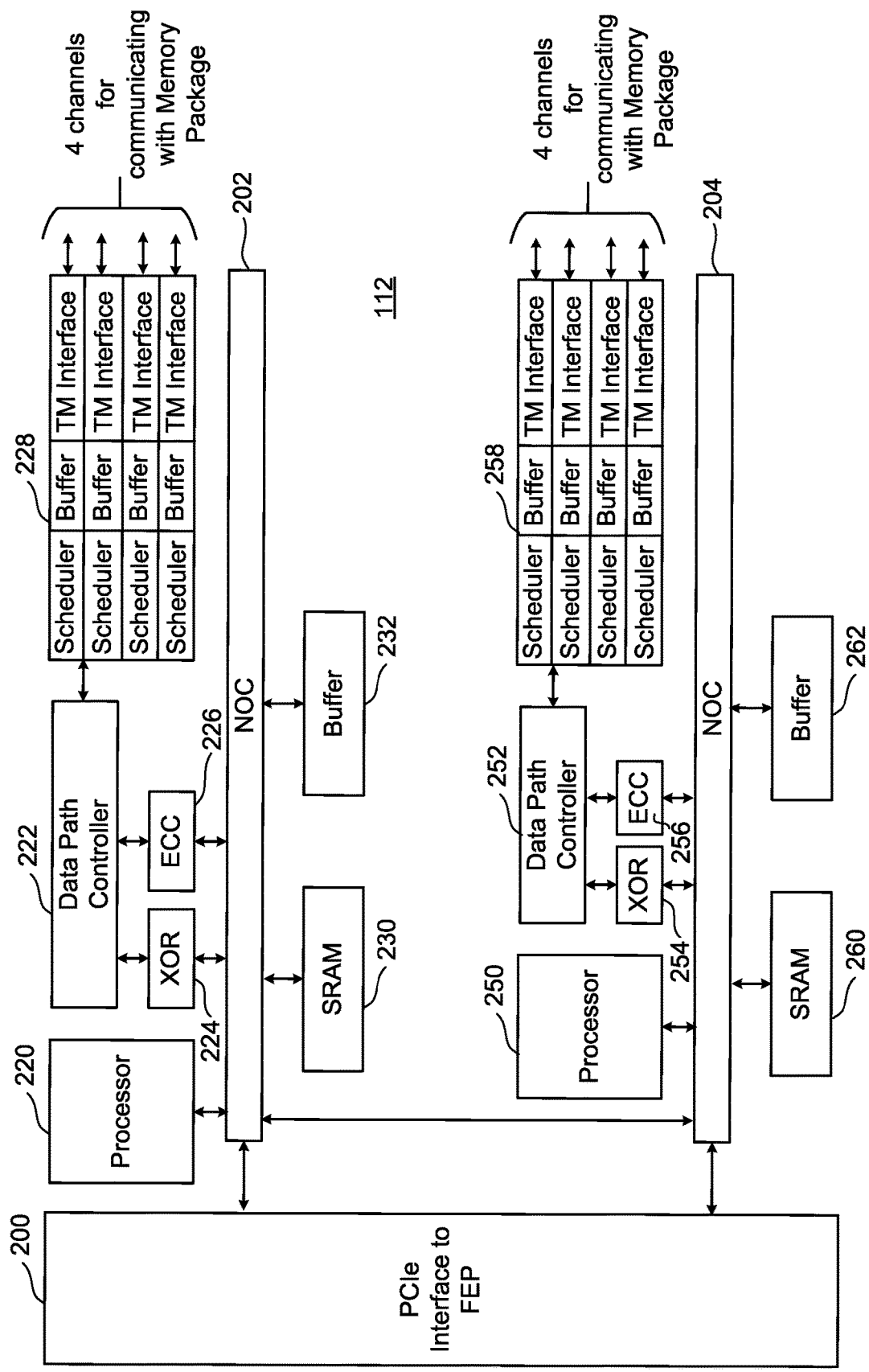
FIG. 2A is a block diagram of one embodiment of a Back-End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

Figure 2B:
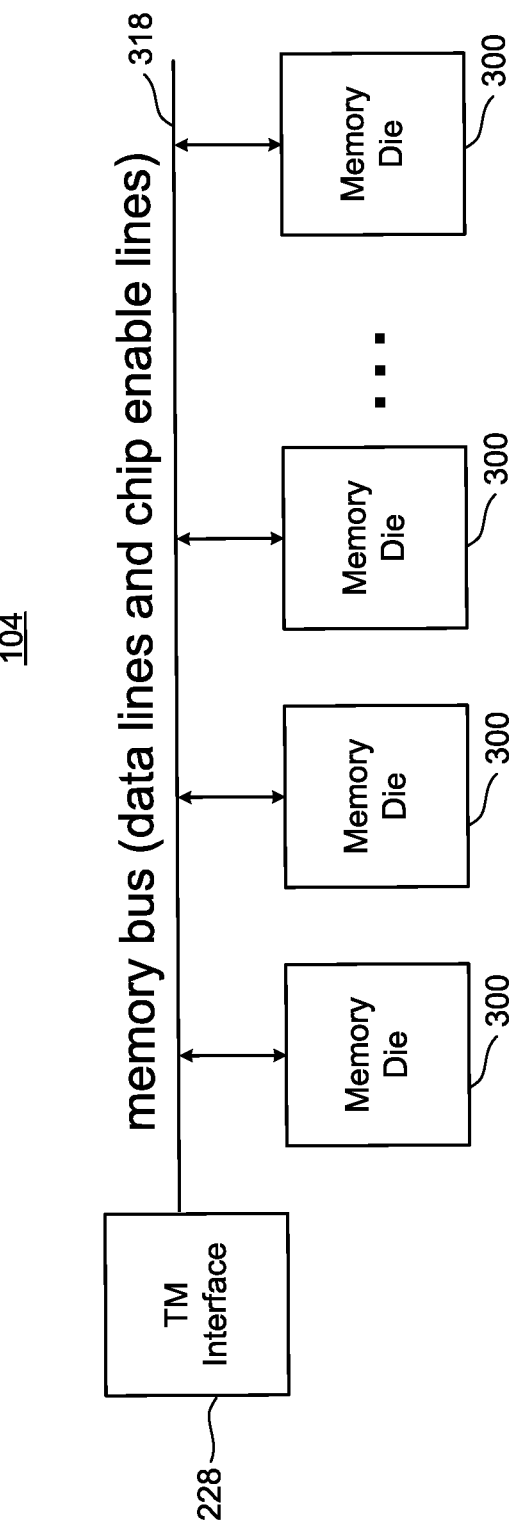
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory dies; however, other numbers of memory dies can also be implemented. The technology described herein is not limited to any particular number of memory dies. In some embodiments, the memory package can also include a processor, CPU device, such as a RISC-V CPU along with some amount of RAM to help implement some of capabilities described below. The technology described herein is not limited to any particular number of memory dies.

Figure 3A:
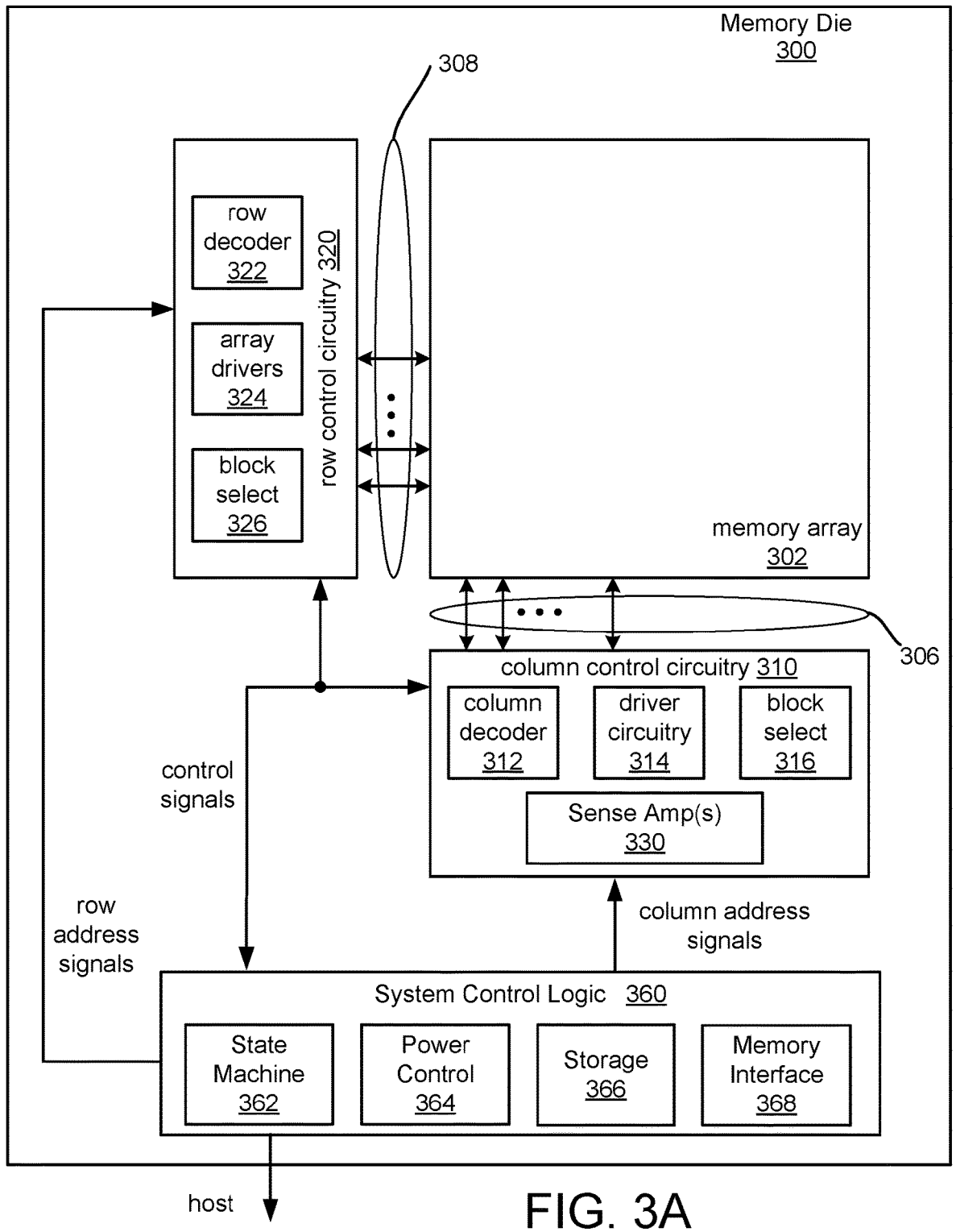
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. System control logic 360 includes storage 366, which may be used to store parameters for operating the memory array 302.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all the elements of memory die 300, including the system control logic 360, can be formed as part of a single die. In other embodiments, some or all of the system control logic 360 can be formed on a different die.

For purposes of this document, the phrase "a control circuit" can include a controller, a state machine, a micro-controller, micro-processor, and/or other control circuitry as represented by the system control logic 360, or other analogous circuits that are used to control non-volatile memory.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 3B:
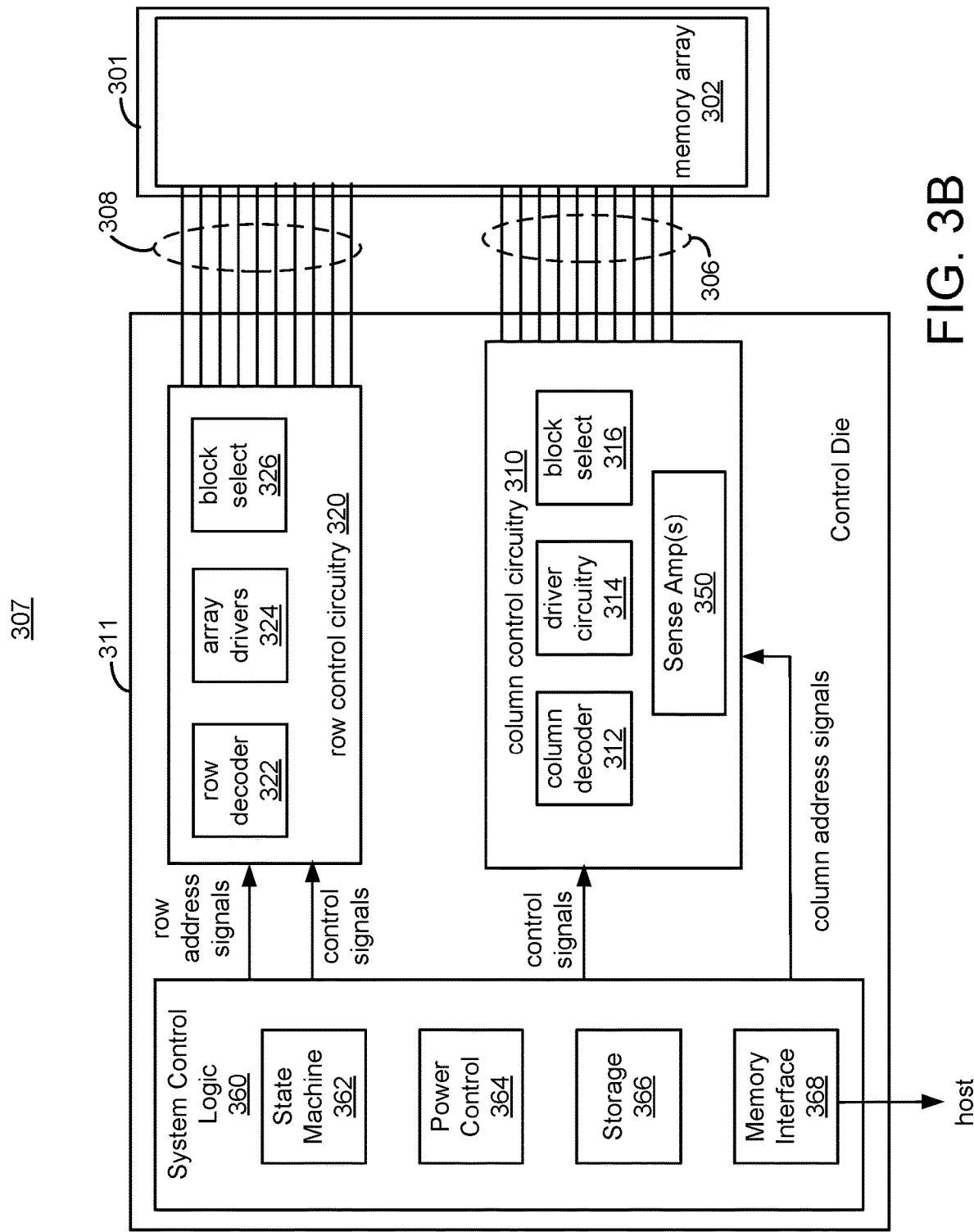
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. The integrated memory assembly 307 includes two types of semiconductor die (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "a control circuit" can include one or more of memory controller 102, system control logic 360, column control circuitry 310, row control circuitry 320, a micro-controller, a state machine, and/or other control circuitry, or other analogous circuits that are used to control non-volatile memory. The control circuit can include hardware only or a combination of hardware and software (including firmware). For example, a controller programmed by firmware to perform the functions described herein is one example of a control circuit. A control circuit can include a processor, PGA (Programmable Gate Array), FPGA (Field Programmable Gate Array), ASIC (Application Specific Integrated Circuit), integrated circuit or other type of circuit.

Figure 4A:
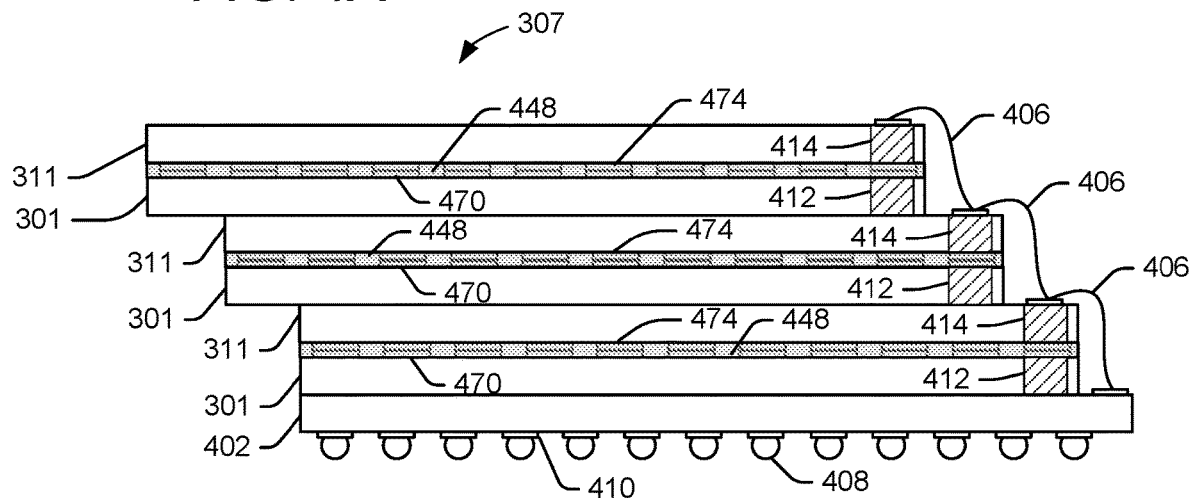
FIG. 4A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control die 311 and multiple memory structure die 301. FIG. 4A depicts a side view of an embodiment of an integrated memory assembly 307 stacked on a substrate 402 (e.g., a stack comprising control dies 311 and memory structure dies 301). The integrated memory assembly 307 has three control dies 311 and three memory structure dies 301. In some embodiments, there are more than three memory structure dies 301 and more than three control die 311.

Each control die 311 is affixed (e.g., bonded) to at least one of the memory structure dies 301. Some of the bond pads 470, 474, are depicted. There may be many more bond pads. A space between two dies 301, 311 that are bonded together is filled with a solid layer 448, which may be formed from epoxy or other resin or polymer. This solid layer 448 protects the electrical connections between the dies 301, 311, and further secures the dies together. Various materials may be used as solid layer 448, but in embodiments, it may be Hysol epoxy resin from Henkel Corp., having offices in California, USA.

The integrated memory assembly 307 may for example be stacked with a stepped offset, leaving the bond pads at each level uncovered and accessible from above. Wire bonds 406 connected to the bond pads connect the control die 311 to the substrate 402. A number of such wire bonds may be formed across the width of each control die 311 (i.e., into the page of FIG. 4A).

A memory structure die through silicon via (TSV) 412 may be used to route signals through a memory structure die 301. A control die through silicon via (TSV) 414 may be used to route signals through a control die 311. The TSVs 412, 414 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package. The solder balls 408 may form a part of the interface between the integrated memory assembly 307 and the memory controller 102.

Figure 4B:
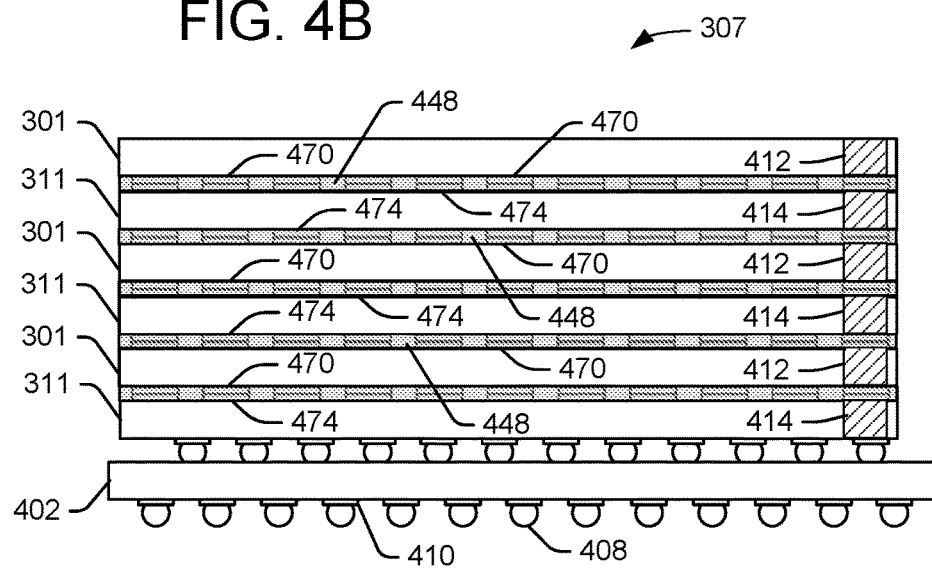
FIG. 4B depicts a side view of an embodiment of an integrated memory assembly stacked on a substrate.

FIG. 4B depicts a side view of an embodiment of an integrated memory assembly 307 stacked on a substrate 402. The integrated memory assembly 307 has three control die 311 and three memory structure die 301. In some embodiments, there are many more than three memory structure dies 301 and many more than three control dies 311. In this example, each control die 311 is bonded to at least one memory structure die 301. Optionally, a control die 311 may be bonded to two memory structure die 301.

Some of the bond pads 470, 474 are depicted. There may be many more bond pads. A space between two dies 301, 311 that are bonded together is filled with a solid layer 448, which may be formed from epoxy or other resin or polymer. In contrast to the example in FIG. 4A, the integrated memory assembly 307 in FIG. 4B does not have a stepped offset. A memory structure die through silicon via (TSV) 412 may be used to route signals through a memory structure die 301. A control die through silicon via (TSV) 414 may be used to route signals through a control die 311.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material.

Figure 5:
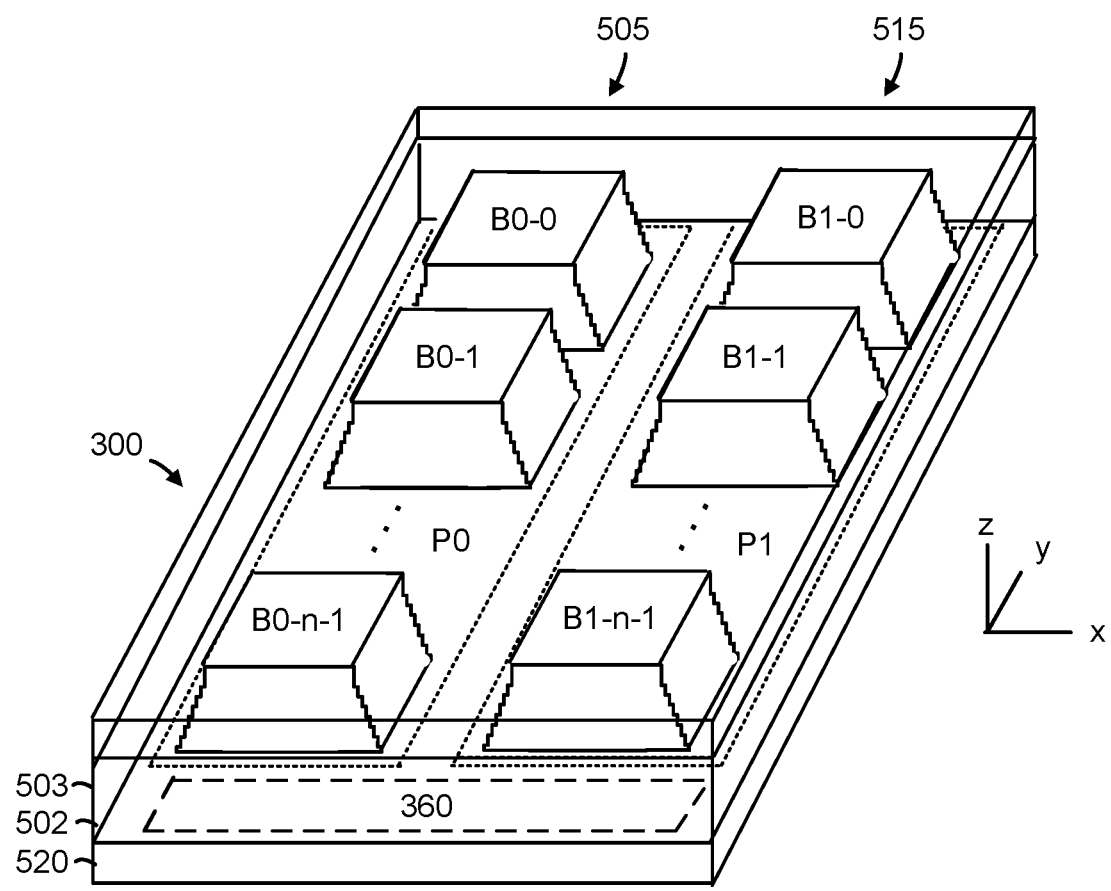
FIG. 5 is a perspective view of an example memory die in which blocks are provided in respective planes P0 and P1.

FIG. 5 is a perspective view of an example memory die 300 in which blocks are provided in respective planes P0 and P1. The memory die includes a substrate 520, an intermediate region 502 in which blocks of NAND strings are formed, and an upper region 503 in which one or more upper metal layers are patterned such as to form bit lines. Planes P0 and P1 represent respective isolation regions which are formed in the substrate 520. Further, a first block sequence 505 of a number n blocks, labelled B0-0 to B0-n-1, are formed in P0, and a second block sequence 515 of a number n blocks, labelled B1-0 to B1-n-1, are formed in P1. Each plane may have associated row and column control circuitry, such as the row control circuitry 320 and column control circuitry 310 of FIG. 3A.

The system control logic 360, which may reside in a peripheral area, may be shared among the planes, in one approach. Each plane may have a separate set of bit lines. In some embodiments, the system control logic 360 is located on a different die than the memory die 300.

By providing blocks of memory cells in multiple planes, parallel operations can be performed in the planes. For example, blocks in different planes can be erased concurrently.

The substrate 520 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 6:
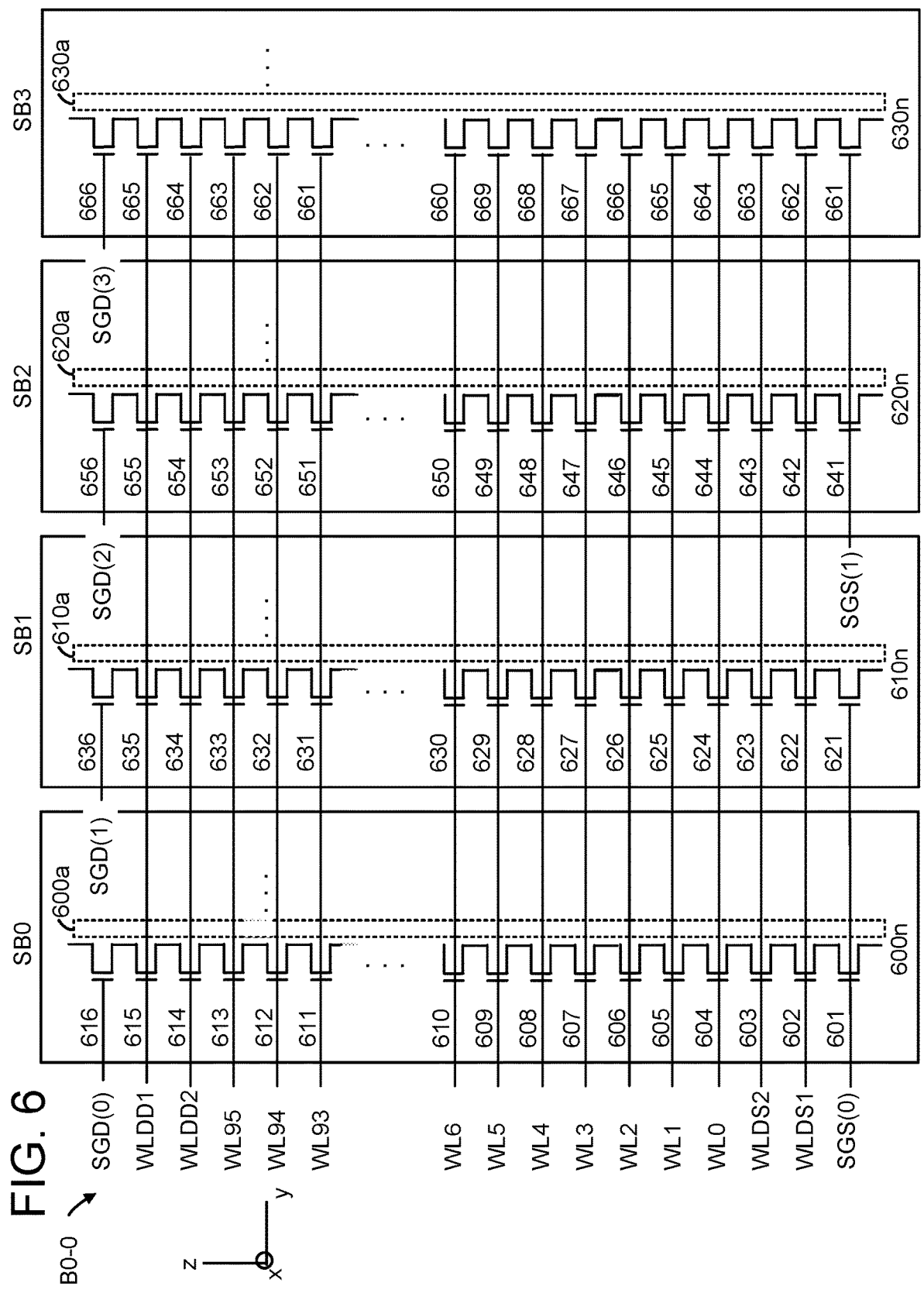
FIG. 6 depicts an example view of sub-blocks of NAND strings in a block.

FIG. 6 depicts an example view of NAND strings in the block B0-0. The NAND strings are arranged in sub-blocks (e.g., SB0, SB1, SB2, SB3) of the block in a 3D configuration. Each sub-block includes multiple NAND strings, where one example NAND string is depicted. For example, SB0, SB1, SB2 and SB3 comprise example NAND strings 600n, 610n, 620n and 630n, respectively. As the term is used herein, a block contains a set of NAND strings that are connected to the same set of word lines. As the term is used herein, a sub-block is a portion of a block that contains a sub-set of NAND strings that are independently selectable for program and read operations. Typically, only one of the sub-blocks in a block is selected for program or read at one point in time. In an embodiment, a sub-block has its own select line in order to independently select the NAND strings. For example, SB0 is selected by SGD(0), SB1 is selected by SGD(1), SB2 is selected by SGD(2), and SB3 is selected by SGD(3). A drain side select line (SGD) is used to connect/disconnect the NAND strings of a sub-block to/from bit lines. In an embodiment, the different sub-blocks of a block share a set of bit lines.

The NAND strings are associated with data word lines, dummy word lines and select gate lines. Each sub-block comprises a set of NAND strings. An individual NAND string extends in the z direction. There are many NAND strings in each sub-block, with a set of NAND strings having a common SGD line extending in the x direction. The NAND strings 600n, 610n, 620n and 630n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example.

Techniques are disclosed herein for an efficient read of NAND memory cells, while mitigating read disturb. In one embodiment, a read sequence includes applying a read spike voltage to word lines and select lines of a selected block to clean residual electrons from the channels of NAND strings in the block. Then, multiple groups of memory cells in the block are read. In one embodiment, memory cells in SB0 that are connected to a selected word line are read, followed by reading memory cells in SB1 that are connected to the selected word line, followed by reading memory cells in SB2 that are connected to the selected word line, followed by reading memory cells in SB3 that are connected to the selected word line. There are other options for reading multiple groups in the block. After a final read of the memory cells in the block, a channel clean operation is performed. In an embodiment, the channel clean includes raising the selected word line voltage to a read pass voltage, followed by lowering all of the word lines from the read pass voltage to a steady state voltage. The read spike and the channel clean mitigate read disturb. By reading multiple groups of memory cells between the read spike and channel clean, the time for the read spike and the channel clean is, in essence, spread out over reading multiple groups. Therefore, the average read time for a group is reduced. Therefore, an efficient read of NAND with read disturb mitigation is provided.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 600n, 610n, 620n and 630n have channels 600a, 610a, 620a and 630a, respectively. Additionally, NAND string 600n includes SGS transistor 601, source-side dummy memory cells 602 and 603, data memory cells 604-613, drain-side dummy memory cells 614 and 615 and SGD transistor 616. NAND string 610n includes SGS transistor 621, source-side dummy memory cells 622 and 623, data memory cells 624-633, drain-side dummy memory cells 634 and 635 and SGD transistor 636. NAND string 620n includes SGS transistor 641, source-side dummy memory cells 642 and 643, data memory cells 644-653, drain-side dummy memory cells 654 and 655 and SGD transistor 656. NAND string 630n includes SGS transistor 661, source-side dummy memory cells 662 and 663, data memory cells 664-673, drain-side dummy memory cell 674 and 675 and SGD transistor 676.

This example depicts one SGD transistor at the drain end of each NAND string, and one SGS transistor at the source end of each NAND string, but multiple SGS and/or SGD transistors could be provided in each NAND string. In one approach, multiple SGD transistors in a NAND string have their control gates connected so that that are driven by a common voltage signal. Multiple SGS transistors in a NAND string can similarly have their control gates connected. The SGD transistors in SB0, SB1, SB2 and SB3 are driven by separate control lines SGD(0), SGD(1), SGD(2) and SGD(3), respectively, in one embodiment. The SGS transistors in SB0, SB1 are driven by one control line SGS(0), with SGS transistors in SB2, SB3 may be driven by another control line SGS(1), in one embodiment. In some embodiments, all SGS transistors in the block are driven by the same SGS control line.

Figure 7:
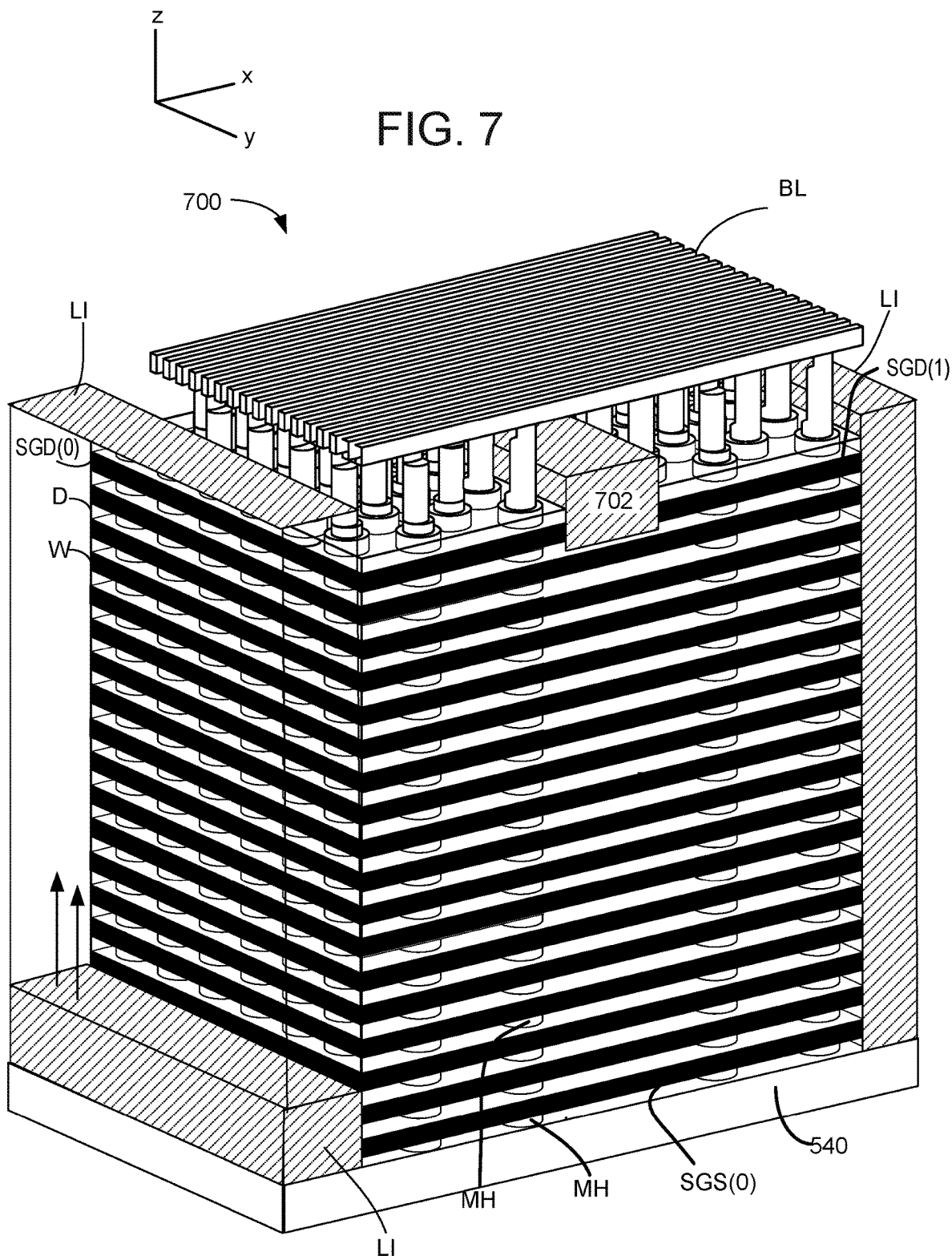
FIG. 7 is a perspective view of an example embodiment of a monolithic three-dimensional (3D) memory structure.

FIG. 7 is a perspective view of one example embodiment of a monolithic three-dimensional (3D) memory structure 700, which may form a portion of memory structure 302. The 3D memory structure 700 includes a plurality non-volatile memory cells arranged as NAND strings. For example, FIG. 7 shows a portion of one block. The 3D memory structure 700 of FIG. 7 shows a portion of two sub-blocks. For example, the 3D memory structure 700 may correspond to a portion of SB0 and SB1. The 3D memory structure 700 will extend in the y direction; therefore, the entire sub-blocks are not depicted in FIG. 7.

The 3D memory structure 700 includes a set of bit lines BL positioned above a stack of alternating dielectric layers and conductive layers with vertical columns of materials extending through the dielectric layers and conductive layers. For example purposes, one of the dielectric layers is marked as D and one of the conductive layers (also called word line layers) is marked as W. The conductive layers may be referred to herein as horizontal conductive layers, as they are horizontal with respect to the substrate. The word line layers contain one or more word lines that are connected to memory cells. For example, a word line may be connected to a control gate of a memory cell. The number of alternating dielectric layers and conductive layers can vary based on specific implementation requirements. One set of embodiments includes between 108-304 alternating dielectric layers and conductive layers. One example embodiment includes 96 data word line layers, 4 select layers, 2 dummy word line layers and 104 dielectric layers. More or fewer than 108-304 layers can also be used.

Two local interconnects LI are depicted on opposite sides of the 3D memory structure 700. Only the lower portion of the LI on the left side of the 3D memory structure 700 is depicted, to allow clear depiction of the memory cells on that side. The two arrows on the lower portion of the LI indicate that the LI extends upwards, along the side of the 3D memory structure 700. An SGD etch structure 702 divides the SGD into SGD(0) and SGD(1). SGD(0) is in SB0 and SGD(1) is in SB1. The SGD etch structure 702 is an insulator, such as silicon oxide.

The lowermost conductive layer is an SGS layer. The SGS layer may correspond to SGS(0) in FIG. 6. Below the alternating dielectric layers and word line layers is the substrate 540, which may contain a source line (SL). Vertical columns of materials (also known as memory holes (MH)) are formed in the stack of alternating dielectric layers and conductive layers. For example, one of the vertical columns/memory holes is marked as MH. Note that in FIG. 7, the dielectric layers are depicted as see-through so that the reader can see the memory holes positioned in the stack of alternating dielectric layers and conductive layers. In one embodiment, NAND strings are formed by filling the vertical column/memory hole with materials including a charge-trapping material to create a vertical column of memory cells. Each memory cell can store one or more bits of data.

Figure 8:
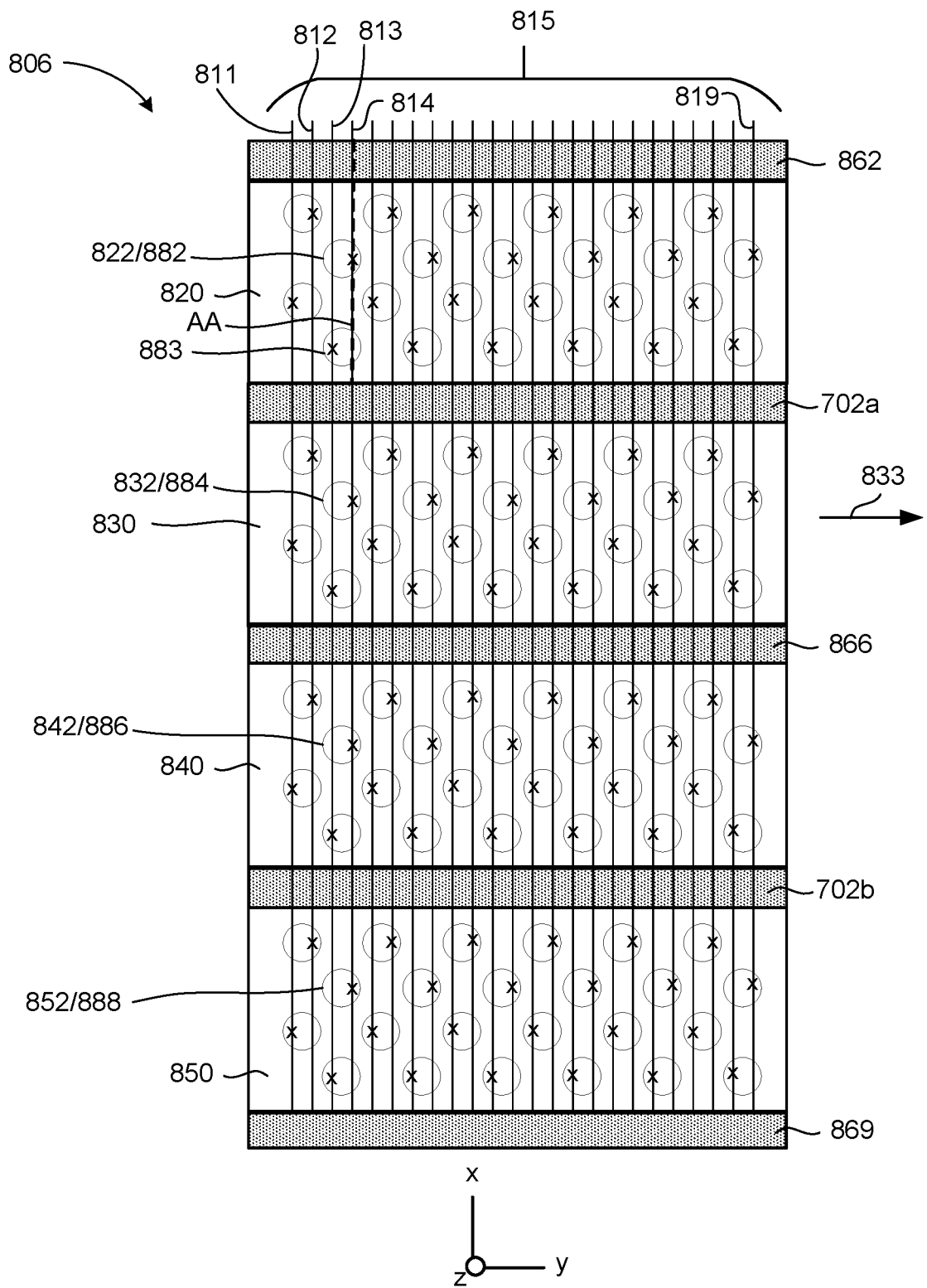
FIG. 8 depicts a top view of a top level of portion of a block of memory cells.

FIG. 8 depicts a view of a portion of a top layer of the 3D memory structure to provide further details of how a block may be divided into sub-blocks, as well as other aspects. FIG. 8 is a diagram depicting a top view of a portion of one block from memory structure 302. The portion of the block depicted in FIG. 8 contains four sub-blocks, as in the example of FIG. 6. As can be seen from FIG. 8, the block extends in the direction of arrow 833. FIG. 8 only shows the top layer (e.g., SGD layer).

FIG. 8 depicts a plurality of circles that represent the vertical columns (or memory holes). Each of the vertical columns include multiple select transistors and multiple memory cells. In one embodiment, each vertical column implements a NAND string. For example, FIG. 8 depicts vertical columns 822, 832, 842 and 852. Vertical column 822 implements NAND string 882. Vertical column 832 implements NAND string 884. Vertical column 842 implements NAND string 886. Vertical column 852 implements NAND string 888. More details of the vertical columns are provided below. Since the block depicted in FIG. 8 extends in the direction of arrow 833, the block includes more vertical columns than depicted in FIG. 8.

FIG. 8 also depicts a set of bit lines 815, including bit lines 811, 812, 813, 814, . . . 819. FIG. 8 shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 814 is connected to vertical columns 822, 832, 842 and 852.

The block depicted in FIG. 8 includes a set of local interconnects (LI) 862, 866, and 869 that connect to the substrate 520 below the vertical columns. The block depicted in FIG. 8 includes two SGD etch structures 702a, 702b. FIG. 7 depicts how the LI connect down to the substrate 520, and how an SGD etch structure 702 divides the SGD layer that is between two LIs into two regions (e.g., SGD(0) and SGD(1)). Hence, LIs 862, 866, and 869 and SGD etch structures 702a, 702b divide the SGD layer of the block into four regions. For example, the layer depicted in FIG. 8 is divided into regions 820, 830, 840 and 850, which are referred to as sub-blocks (e.g., SB0, SB1, SB2, and SB3). In the lower layers of the block that implement memory cells, it is not required for the two SGD etch structures 702a, 702b to be present (see, FIG. 7). However, optionally, the two SGD etch structures 702a, 702b could extend down to the substrate 520. By providing four separate SGD lines, the block can be operated as four sub-blocks. In some embodiments, the word line regions at a given level connect together at the end of the block to form a single word line. In another embodiment, the word line regions on the same level are not connected together.

In one example implementation, a bit line only connects to one vertical column in each of regions 820, 830, 840 and 850. In that implementation, each block has sixteen rows of active columns and each bit line connects to four rows in each block. In one embodiment, all of four rows connected to a common bit line are connected to the same word line (via different word line sub-blocks on the same level that are connected together); therefore, the system uses the source side select lines and the drain side select lines to choose one (or another subset) of the four to be subjected to a memory operation (program, verify, read, and/or erase).

Although FIG. 8 shows each region having four rows of vertical columns, four regions and sixteen rows of vertical columns in a block, those exact numbers are an example implementation. Other embodiments may include more or fewer regions per block, more or fewer rows of vertical columns per region and more or fewer rows of vertical columns per block.

FIG. 8 also shows the vertical columns being staggered. In other embodiments, different patterns of staggering can be used. In some embodiments, the vertical columns are not staggered.

FIG. 9A depicts an example cross-sectional view of a portion of a sub-block, including NAND strings 882 and 883, in a single-tier stack. FIG. 9A depicts a cross-sectional view along line AA in FIG. 8. In this example, the NAND strings 882 and 883 are in the same sub-block (e.g., 580). NAND string 882 is connected to BL3 (referred to as 814 in FIG. 8). The bit line to which NAND string 883 is connected (813 in FIG. 8) is not depicted in FIG. 9A.

The sub-block comprises a stack 910 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS1, WLDS2, WL0-WL95, WLDD2, WLDD1 and SGD(0). The conductive layers connected to control gates of data memory cells are referred to as data word lines. A memory controller considers the data memory cells to be eligible to store user data. In this example, the stack includes ninety-six data word lines, WL0-WL95. The data word lines are separated by dielectric layers. DL is an example dielectric layer.

The conductive layers connected to control gates of dummy memory cells are referred to as dummy word lines. Dummy memory cells can have the same construction as data memory cells but are considered by the memory controller to be ineligible to store any type of data including user data. The dummy memory cells can provide a buffer region such as to provide a gradual transition in the channel voltage. This helps prevent disturbs of data memory cells. One or more dummy memory cells may be provided at the drain and/or source ends of a NAND string of memory cells. In a multi-tier stack, dummy memory cells can be provided adjacent to the interface, above and below the interface. For example, see FIG. 9B, and the upper and lower interface dummy word lines, WLIFDU and WLIFDL, respectively.

The conductive layers connected to control gates of source-side select gate transistors (SGS transistors) and drain-side select gate transistors (SGD transistors) are referred to as source-side and drain-side control lines, respectively. The SGD transistor is used to electrically connect the drain end of a NAND string to a bit line, and the SGS transistor is used to electrically connect the source end of a NAND string to a source line, as is appropriate during various operations including programming, erasing and reading.

A top 910t and bottom 910b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, with select gate transistors formed in regions in which the SGS and SGD control lines intersect with the multiple thin layers. For example, a drain-side select gate transistor 916 is formed where the SGD control line intersects with the multiple thin layers, a source-side select gate transistor 901 is formed where the SGS control line intersects with the multiple thin layers, a topmost data memory cell 914 is formed where the WL95 word line intersects with the multiple thin layers, and a bottom most data memory cell 903 is formed where the WL0 word line intersects with the multiple thin layers.

The multiple thin layers can form annular layers and can be deposited, e.g., using atomic layer deposition. For example, the layers can include a blocking oxide layer 963, a charge-trapping layer 964 or film such as silicon nitride (Si3N4) or other nitride, a tunneling layer 965 (e.g., a gate oxide) and a channel 960 (e.g., comprising polysilicon). A dielectric core 966 (e.g., comprising silicon dioxide) can also be provided. A word line or control line can comprise a metal such as Tungsten. In this example, all the layers are provided in the memory hole. In other approaches, some of the layers can be provided in the word line or control line layer. The multiple thin layers form a columnar active area (AA) of a NAND string.

The stack is formed on a substrate 540. In one approach, the substrate includes a p-well region 922 connected to the source ends of the NAND strings. The p-well region may comprise epitaxial regions 922 which extend upward adjacent to the source-side select gate transistors. The p-well region can include an n+ contact 924 connected to a local interconnect 951 for receiving a source line voltage, and a p+ contact 926 connected to a p-well contact 982 for receiving a p-well voltage. The local interconnect 951 can comprise a conductive material 951b such as metal surrounded by insulating material 951a to prevent conduction with the metal of the adjacent word lines. The p-well region is formed in an n-well 928, which in turn is formed in a p-type semiconductor region 930 of the substrate 540, in one possible implementation.

The NAND string 1082 has a source end 900s at a bottom 910b of the stack 910, connected to the p-well. The NAND string 882 also has a drain end 900d at a top 910t of the stack, connected to a bit line BL3 via a bit line contact 980 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vt of a memory cell is increased in proportion to the amount of stored charge. During an erase operation, the channels of the NAND string are charged up, such as by applying a positive erase pulse to the substrate via the local interconnect 951, causing the electrons to return to the channel from the charge trapping layer.

In this example, the SGS transistors have a body 810, but do not include the multiple thin layers 960, 963, 964 and 965. As a result, there is a reduced likelihood of a Vt shift.

Figure 9B:
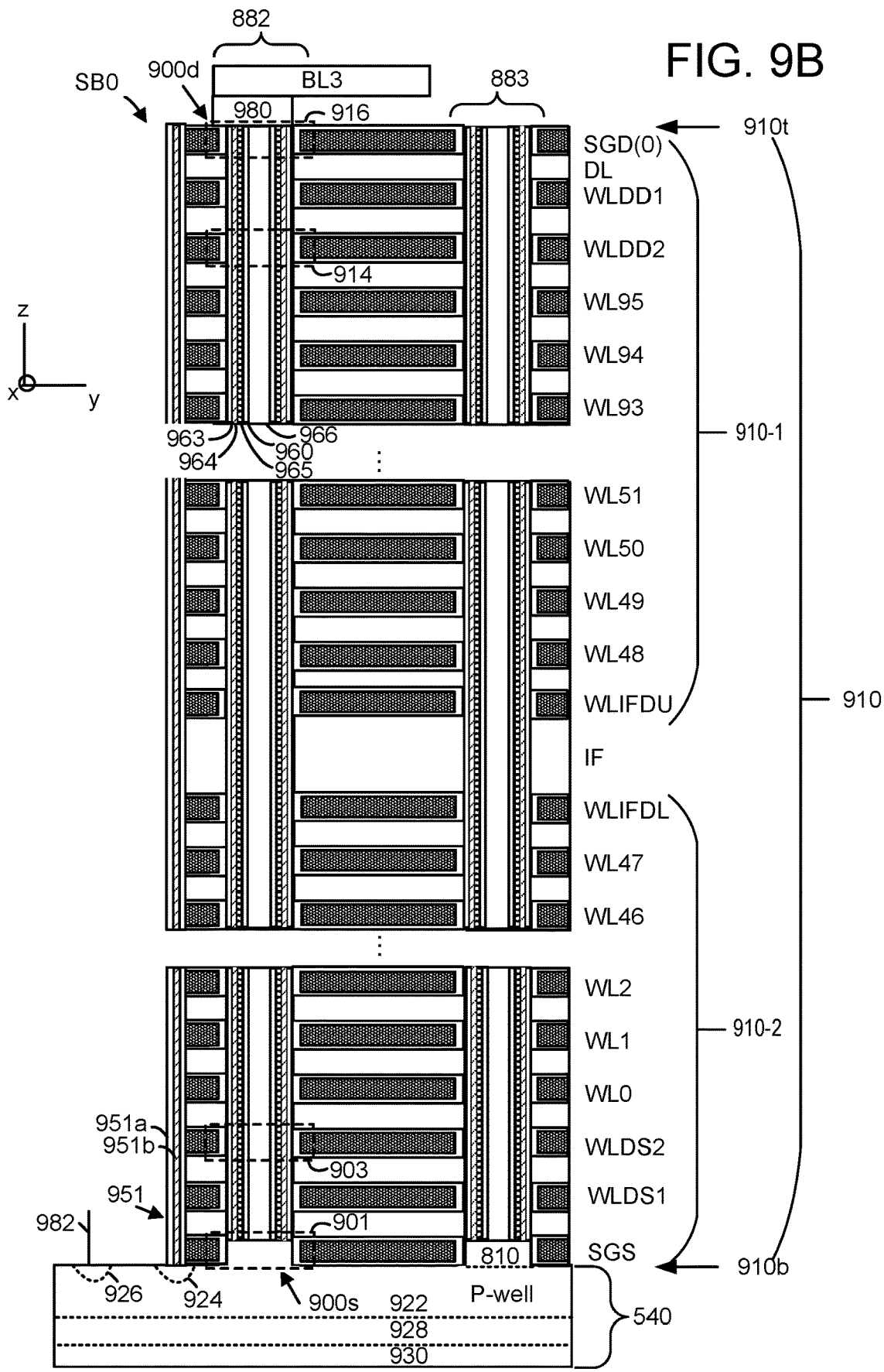

FIG. 9B depicts an example cross-sectional view of a portion of a sub-block, including NAND strings 882 and 883, in a two-tier stack comprising an upper tier 910-1 and a lower tier 910-2. A two-tier other multi-tier stack can be used to form a relatively tall stack while maintaining a relatively narrow memory hole width. After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole was etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines.

The configurations of the substrate in FIGS. 9A and 9B may be used when a p-well erase is used. During one embodiment of p-well erase, an erase voltage is applied to the p-well contact 982. The LI 951 may be floated and may couple up to the erase voltage. A depletion region (fully or partially) is formed in the p-well region 922 due to the migration of electrons out of the depletion region toward the n+ contact 924 and thus holes get accumulated. The resulting holes then migrate from the depletion region into the NAND channel 960 to recombine with trapped electrons in the charge storage regions 964 and thus erase the memory cells.

Figure 10:
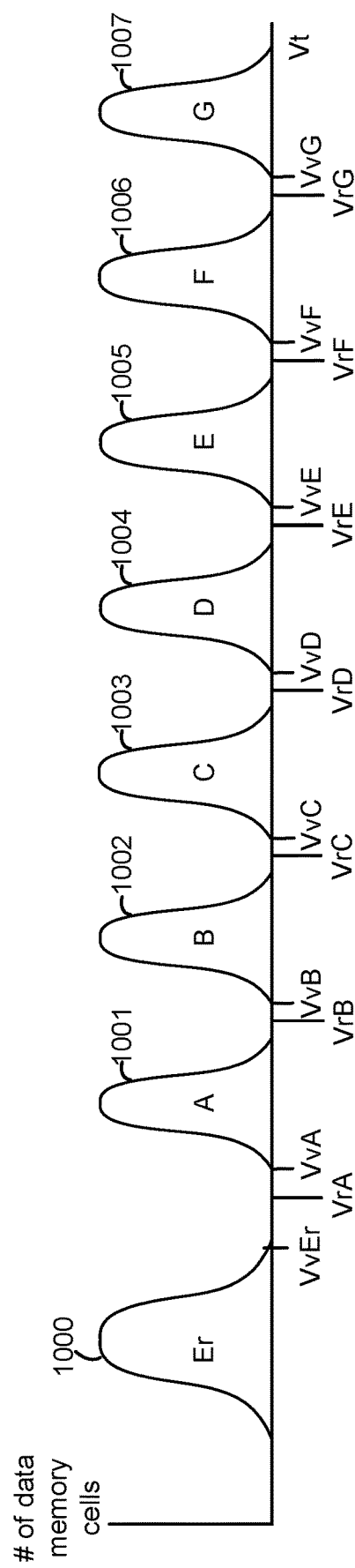
FIG. 10 depicts threshold voltage (Vt) distributions for data memory cells in an eight-state memory device.

FIG. 10 depicts threshold voltage (Vt) distributions for data memory cells in an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vt distributions can represent memory cells connected to a word line or all memory cells in a block. After erasing the block, the Vt distribution 1000 is obtained, representing the erased state. The erase operation is completed when the Vt of all, or nearly all, of the data memory cells is below a verify voltage, VvEr.

During an erase-verify test for data memory cells, the state machine checks the number of upper tail memory cells which have Vt>VvEr. If the number of memory cells which are sensed as '0' cells, e.g., non-conductive, is larger than predefined value, then another erase pulse and erase-verify are used.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vt distributions 1001-1007, respectively. These memory cells are subject to verify tests using verify voltages of VvA-VvG.

Memory cells are read by reading at read reference voltages VrA-VrG. Storing three bits per memory cell, as in the example of FIG. 10, allows three pages to be stored in a group of memory cells. Typically, this group of memory cells is connected to the same word line. Moreover, this group may be in the same sub-block. For example, memory cells on WL0 in SB0 could store three pages, memory cells on WL0 in SB1 could store three pages, memory cells on WL0 in SB2 could store three pages, and memory cells on WL0 in SB3 could store three pages. A group of memory cells that stores one or more pages of data will be referred to herein as a page of memory cells.

In some embodiments, one page is read by sensing a page of memory cells at a set of read reference voltages that are associated with that page. For example, reading at VrA and VrE may be used to read a lower page, reading at VrB, VrD, and VrF may be used to read a middle page and reading at VrC and VrG. However, many other page coding schemes are possible.

Figure 11:
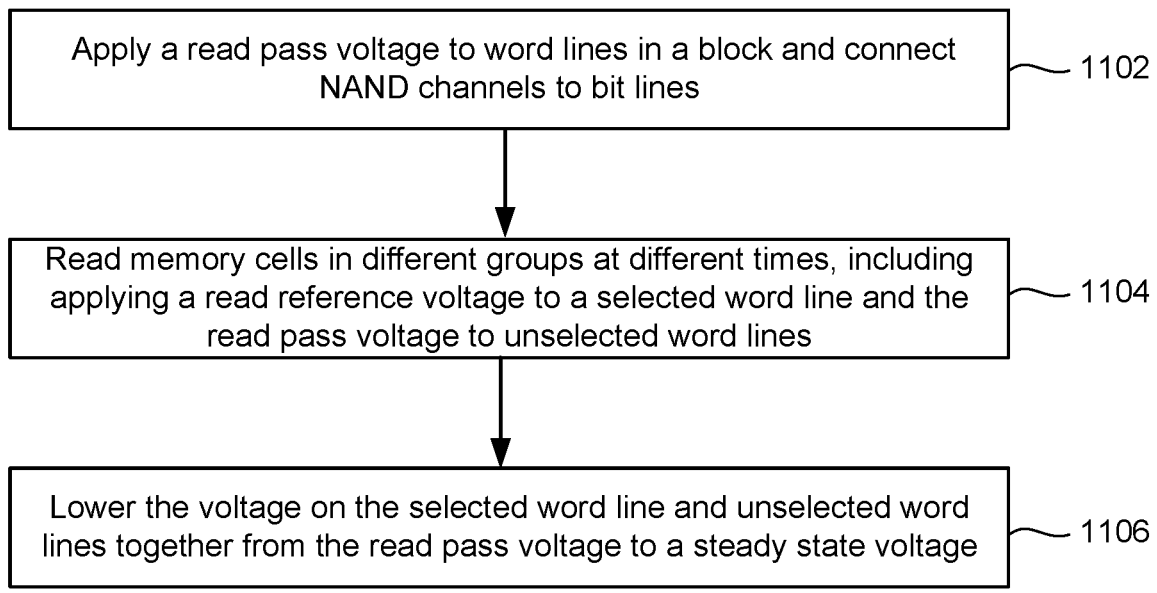
FIG. 11 is flowchart of one embodiment of a process of reading non-volatile memory cells in different groups.

FIG. 11 is flowchart of one embodiment of a process 1100 of reading non-volatile memory cells in different groups.

The process 1100 has a single read spike operation to remove residual electrons from NAND channels prior to reading the different groups. After reading the different groups, the process has a single channel clean operation. The read spike and the channel clean reduce or eliminate read disturb. By reading multiple groups of memory cells between the read spike and channel clean, the average time to read each group is low. Process 1100 may be used to read memory cells in a three-dimensional memory structure including, but not limited to, the examples in FIGS. 5-9B. Process 1100 could be used when each memory cell stores a single bit ("single-level cell" or "SLC") or when each memory cell stores multiple bits ("multi-level cell" or "MLC"). In an embodiment, each group of memory cells is a unit referred to herein as a page of memory cells. A page of SLC cells will store one page, a page of MLC cells will store multiple pages. For example, a page of memory cells that each store three bits will store three pages. In one embodiment, the state machine 362 controls process 1100. The state machine 362 may initiate process 1100 in response to receiving a read command from the memory controller 102. In one embodiment, the read command specifies what pages are to be read. In one embodiment, the read command specifies the physical addresses of the groups of memory cells.

Step 1102 includes applying a read pass voltage to word lines in a block and connecting NAND channels to bit lines. In one embodiment, connecting NAND channels to bit lines includes turning on drain side select transistors to connect the NAND channels to bit lines. In an embodiment, step 1102 drains residual electrons from channels of the NAND strings. Draining residual electrons from channels of the NAND strings reduces or eliminates HCI. Hence, step 1102 reduces or eliminates read disturb.

Step 1104 includes reading memory cells in different groups at different times. In one embodiment, each group is a page of memory cells. Step 1104 includes applying a read reference voltage to a selected word line while applying a read pass voltage to unselected word lines. Using the example in FIG. 10, the read reference voltage could be any of VrA-VrG. The read pass voltage has a sufficient magnitude such that all of the unselected memory cells should "turn on". Hence, whether a selected NAND string conducts a current will depend on whether the selected memory cell on that NAND string turns on and conducts a current in response to the read reference voltage.

In one embodiment, the different groups are different sub-blocks (e.g., SB0, SB1, SB2, and SB3 in FIG. 6). There may be more or fewer than four sub-blocks that are read in step 1104. In one embodiment, the memory cells that are read in step 1104 are all connected to the same word line. For example, step 1104 could include reading memory cells connected to WL10 in SB0, followed by reading memory cells connected to WL10 in SB1, followed by reading memory cells connected to WL10 in SB2, followed reading by memory cells connected to WL10 in SB3. In some embodiments, after reading the memory cells in the different sub-blocks at one read reference level, the memory cells are then read in the same sequence at another read reference level.

Step 1106 includes lowering the voltage on the selected word line and the unselected word lines from the read pass voltage to a steady state voltage. The selected word line will typically be at one of the read reference voltages just prior to step 1106. Hence, step 1106 may also include first raising the voltage on the selected word line from a read reference voltage to the read pass voltage. In step 1106, the voltages on the word lines may be reduced in unison, which prevents voltage gradients in the NAND channel. If the selected word line were to be lowered from a read reference voltage while the unselected word lines are lowered from the read pass voltage, there will be a significant voltage difference between the selected word line and the two adjacent unselected word lines. This voltage difference may result in a significant voltage gradient in the NAND channel below those word lines. This voltage gradient in the NAND channel could cause read disturb. Step 1106 reduces or prevents such read disturb. Step 1106 is referred to herein as a channel clean operation.

Figure 12:
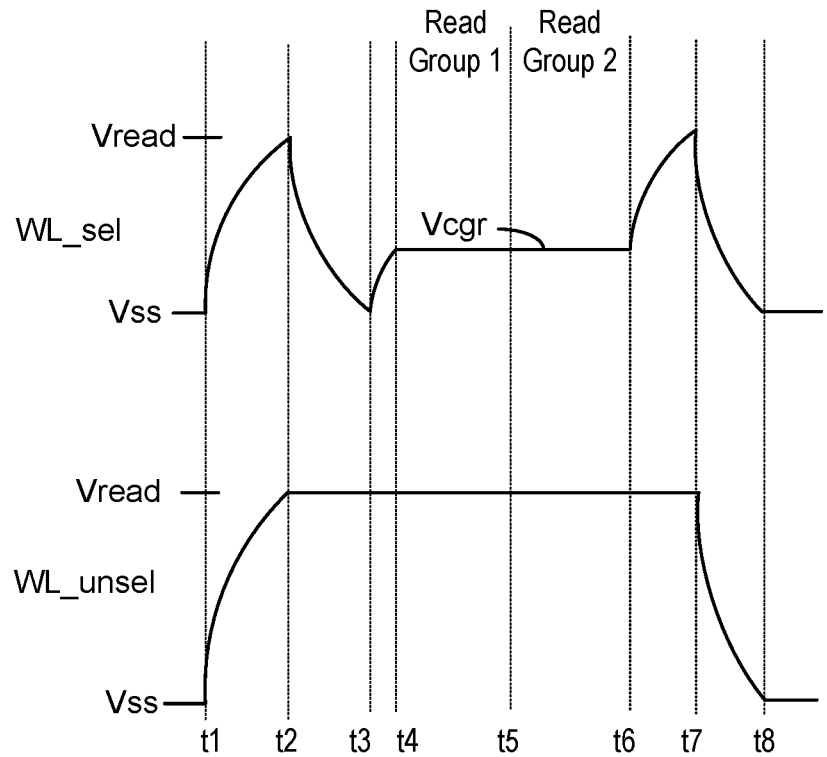
FIG. 12 is a timing diagram of voltages applied to word lines during one embodiment of the process of FIG. 11.

FIG. 12 is a timing diagram of voltages applied to word lines during one embodiment of process 1100. Between time t1 and t2 the voltages on the selected word line and the unselected word lines are raised from a steady state voltage (e.g., Vss) to a read pass voltage (Vread). The foregoing occurs during one embodiment of step 1102 of process 1100. Between t2 and t3, the voltage on the selected word line is lowered from the read pass voltage to the steady state voltage. The voltage applied to the selected word line between t1 and t3 may be referred to herein as a read spike voltage. In one embodiment, drain side select transistors are turned on, at least at t2, in order to connect the NAND channels to bit lines to allow residual electrons to drain to the bit lines.

Between t3 and t4 the voltage on the selected word line is raised from Vss to a read reference voltage (Vcgr). Between t4 and t5 memory cells in a first group are read. Between t5 and t6 memory cells in a second group are read. The reading of the memory cells in the different groups occurs during one embodiment of step 1104 of process 1100.

Between t6 and t7 the voltage on the selected word line is raised from the read reference voltage to Vread. Between t7 and t8 the voltages on the selected word line and the unselected word lines are lowered from Vread to Vss. The lowering of the voltages between t7 and t8 occurs during one embodiment of step 1106 of process 1100. Note that the voltages on the unselected word lines are kept at Vread between t2 and t7. In other embodiments, the voltages on the unselected word lines are not kept at Vread while reading the multiple different groups of memory cells.

Figure 13:
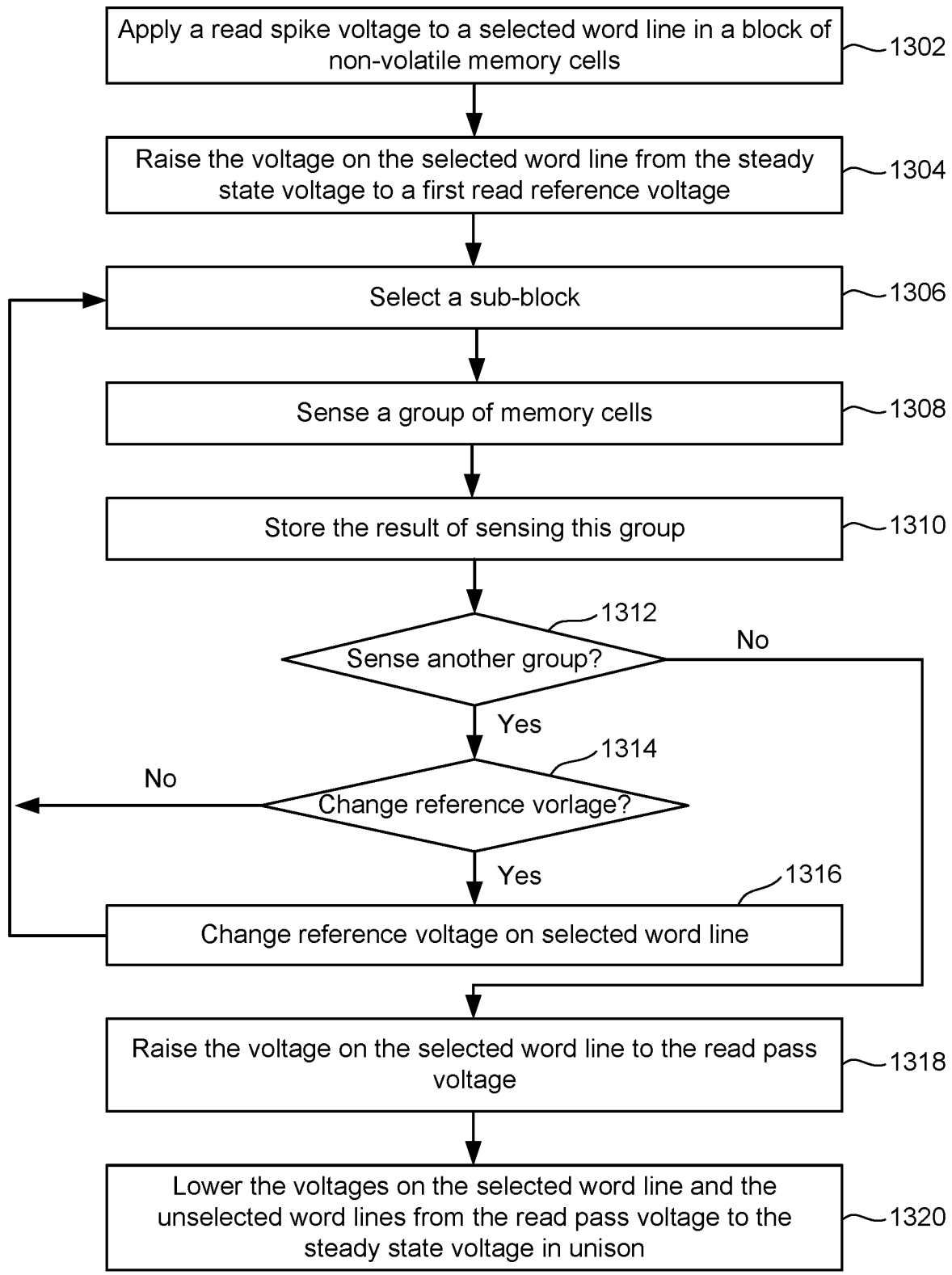
FIG. 13 is a flowchart of one embodiment of a process of reading groups of memory cells in different sub-blocks between a read spike and a channel clean operation.
Figure 14:
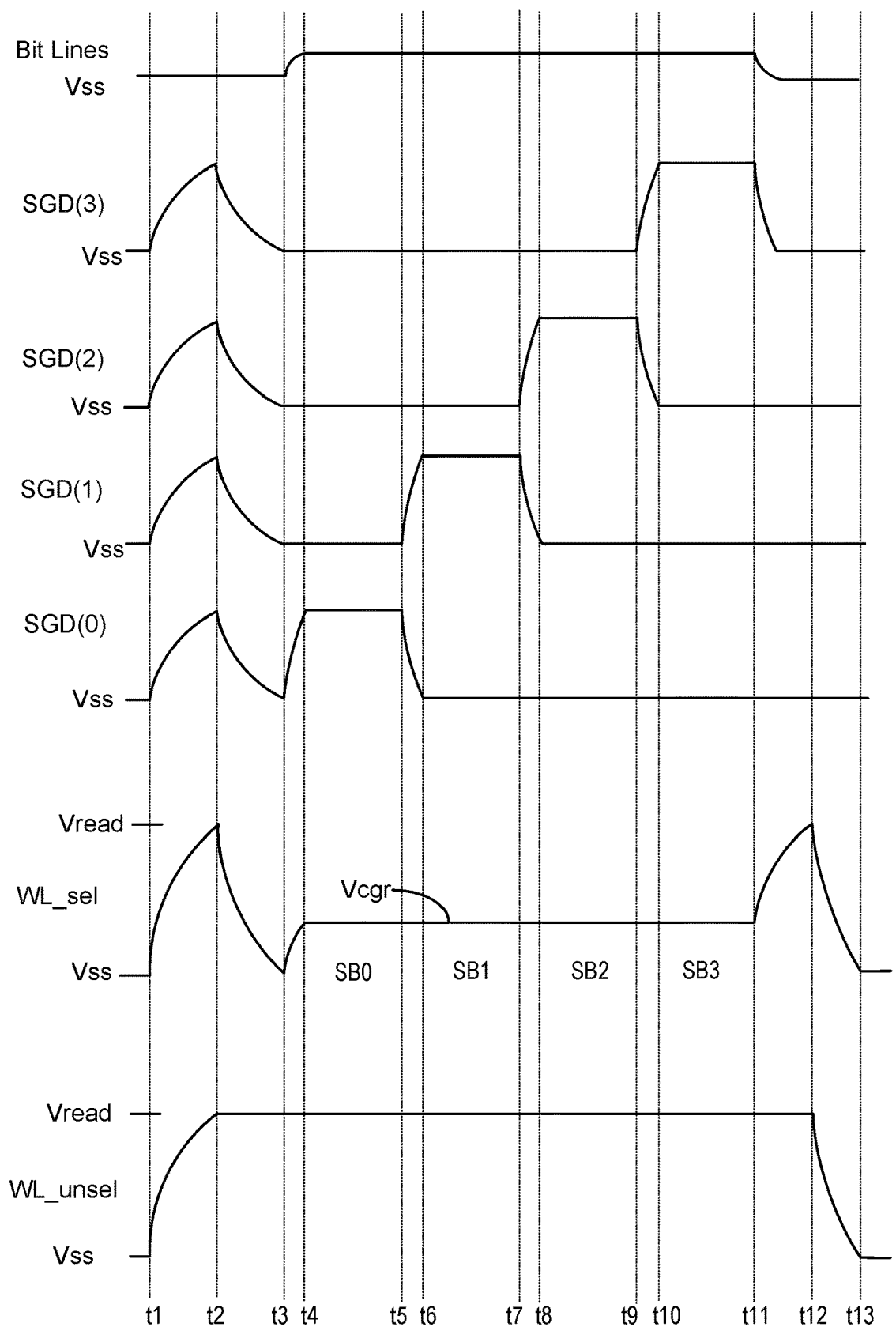
FIG. 14 depicts timing of voltages applied to word lines, select lines and bit lines during an embodiment of a read operation.

In one embodiment, the groups of memory cells that are read are memory cells on the same word line but in different sub-blocks. FIG. 13 is a flowchart of one embodiment of a process 1300 of reading groups of memory cells in different sub-blocks between a read spike and a channel clean operation. Process 1300 will be discussed with reference to the timing diagram in FIG. 14. FIG. 14 depicts timing of voltages applied to word lines, select lines and bit lines during an embodiment of a read operation. Process 1300 provides further details for one embodiment of process 1100. In one embodiment, the state machine 362 controls process 1300.

Step 1302 includes applying a read spike voltage to a selected word line in a block of non-volatile memory cells. With reference to FIG. 14, the voltage on the selected word line (WL_sel) is raised from a steady state voltage (Vss) at t1 to Vread by t2. Between t2 and t3 the voltage on the selected word line is lowered from Vread to Vss. The voltage could be held at Vread for a brief period of time. Step 1302 may also include raising the voltages on the unselected word lines to Vread. With respect to FIG. 14, the voltages on the unselected word lines (WL_unsel) is raised from Vss to Vread between t1 and t2. Although the timing of voltages for dummy word lines are not depicted in FIG. 14, in one embodiment, the voltages on the dummy word lines are the same as those of the unselected word lines. Step 1302 may also include applying a spike voltage to drain side select lines of the block. With reference to FIG. 14, the voltage timing for four drain side select lines is depicted. These correspond to an embodiment that is consistent with FIGS. 6-8. However, there may be more or fewer than four drain side select lines. A spike voltage is applied to the drain side select lines (SGD(0), SGD(1), SGD(2), SGD(3)) between t1 and t3. The spike voltage will turn on the drain side select transistors, such that the NAND channels are connected to the bit lines. Therefore, residual electrons in the NAND channels are removed. Note that 1302 is one embodiment of step 1102 of process 1100.

Step 1304 includes raising the voltage on the selected word line from the steady state voltage to a first read reference voltage. With respect to FIG. 14, the voltage on WL_sel is raised between t3 and t4 from Vss to a read reference voltage (Vcgr). The read reference voltage could be any read reference voltage. In one embodiment, it is a read reference voltage used to distinguish between the two states for SLC memory cells. In one embodiment, it is one of the read reference voltages used for MLC memory cells. In one embodiment, the bit line voltage is also raised in step 1304. In one embodiment, the bit line voltage is raised to about 0.25V.

Step 1306 includes selecting a sub-block. In one embodiment, the sub-block is selected by connecting NAND strings in the selected sub-block to the bit lines, while keeping NAND strings of unselected sub-blocks disconnected from the bit lines. In one embodiment, a select voltage is applied to an SGD of a selected sub-block to turn on drain side select transistors. In one embodiment, an unselect voltage is applied to SGDs of unselected sub-blocks to turn off drain side select transistors. With respect to FIG. 14, SGD(0) is raised from Vss to a select voltage between t3 and t4. The select voltage has a sufficient magnitude to turn on the drain side select transistors. Between t4 and t5 SGD(0) is held at the select voltage. Other SGDs (SGD(1), SGD(2), SGD(3)) are at Vss between t3 and t5 to keep their respective drain side select transistors off. Hence between t3 and t5, SB0 is selected, whereas SB1, SB2, and SB3 are unselected.

Step 1308 includes sensing a group of memory cells. For example, memory cells that are both connected to WL10 (an example of the selected word line) and in SB0 are sensed. With reference to FIG. 14, this sensing occurs between t4 and t5. Step 1310 includes storing the result of sensing this group. In one embodiment, the results are stored in data latches on the memory die 300. In one embodiment, the results are stored in data latches on the control die 311. The data latches could be located in sense amps 350.

Step 1312 includes a determination of whether there is another group to sense. If there is another group to sense, a determination is made as to whether to change the reference voltage to the selected word line. In some embodiments, after sensing all of the groups of memory cells at the first reference voltage, the selected word line voltage is changed to a second read reference voltage. Further details of such an embodiment will be discussed below (see discussion of FIG. 20). Whether or not the reference voltage is changed, control passes to step 1306. Step 1306 includes selecting a sub-block. With reference to FIG. 14, between t5 and t6 the voltage on SGD(1) is raised from Vss to a select voltage. Between t6 and t7, the voltage on SGD(1) is kept at the select voltage to select SB1. The other SGDs are at Vss between t6 and t7, such that other sub-blocks are not selected.

Steps 1308 and 1310 proceed again, as described above, except for the sensing being of the presently selected sub-block (e.g., SB1). The process 1300 continues with sensing other groups until all groups have been sensed (step 1312 is no). With reference to FIG. 14, SB2 is sensed between t8 and t9, and SB3 is sensed between t10 and t11. Note that steps 1306 to 1316 are one embodiment of step 1104 of process 1100.

After it is determined in step 1312 that all groups have been sensed, step 1318 is performed. Step 1318 includes raising the voltage on the selected word line to the read pass voltage. With reference to FIG. 14, the voltage on WL_sel is raised from Vcgr to Vread between t11 and t12. Step 1320 includes lowing the voltages on the selected word line and the unselected word lines from the read pass voltage to the steady state voltage in unison. With reference to FIG. 14, between t12 and t13 the voltage on the WL_sel and WL_unsel are lowered from Vread to Vss. Note that steps 1318 and 1320 are one embodiment of step 1106 of process 1100.

One possible concern when reading memory cells is having a voltage gradient between SGD and a data word line close to the SGD. For example, it is possible to have a voltage gradient between SGD and WL95 in the architecture depicted in FIG. 9A. This voltage gradient could cause read disturb to memory cells connected to WL95. However, there are two dummy word lines (WLDD1, WLDD2) between WL95 and SGD in order to mitigate this voltage gradient. However, in some cases, there may still be a concern with a voltage gradient between SGD and WL95 causing read disturb. In some embodiments, the voltage on the dummy word lines is held at the read pass voltage when reading the memory cells, similar to how the read pass voltage is applied to the unselected word lines. In some embodiments, the voltage on the dummy word lines and the unselected word lines is brought down to a steady state voltage between reading each group of memory cells. This reduces the aforementioned voltage gradient in the NAND channel. Hence, read disturb can be reduced or eliminated. Also note that the voltage on the selected word line may be brought down to the steady state voltage between reading each group.

Figure 15:
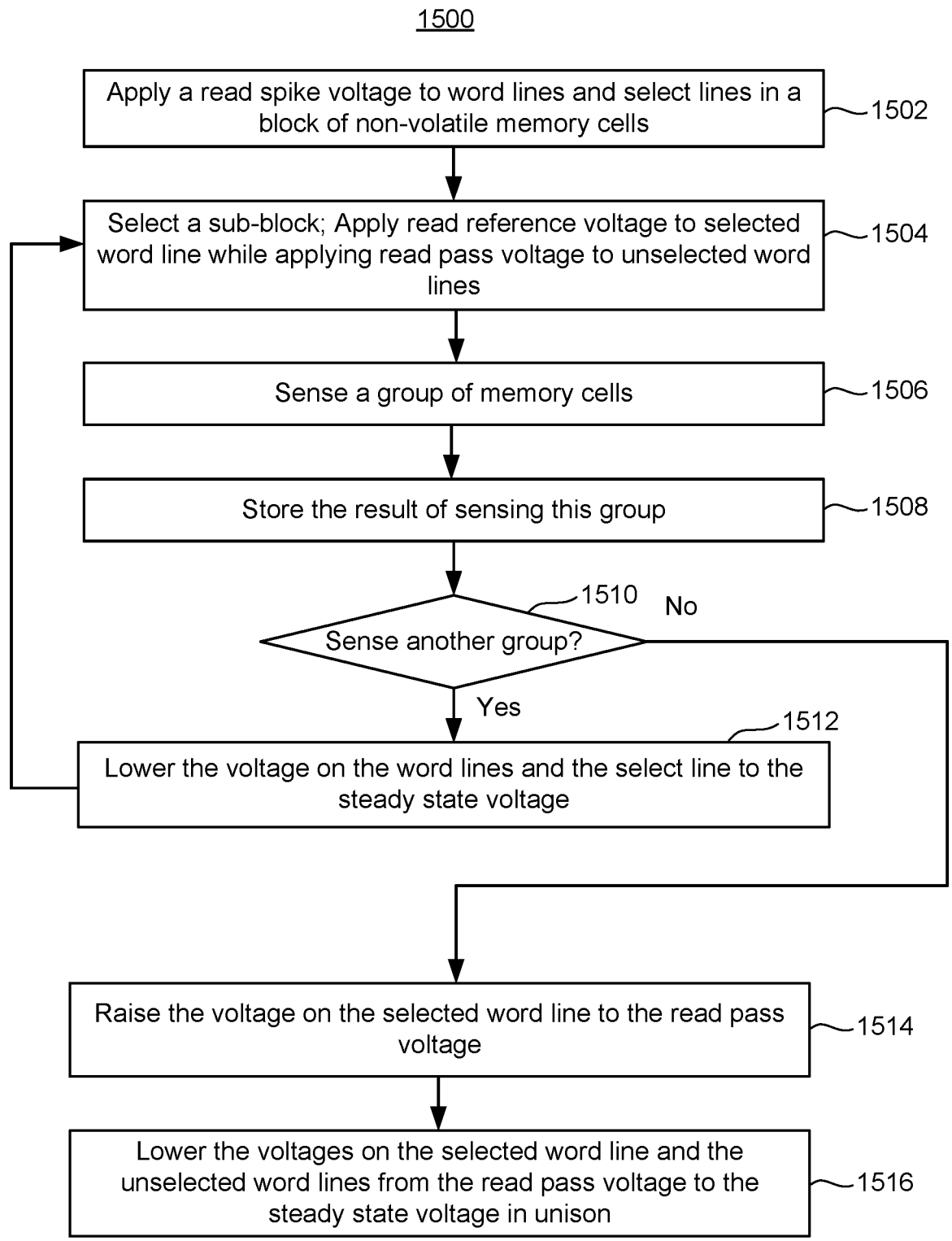
FIG. 15 is a flowchart of one embodiment of a process of reading multiple groups of memory cells between a read spike and channel clean in which the voltage on the unselected word lines is brought down to a steady state voltage between reading each group of memory cells.
Figure 16:
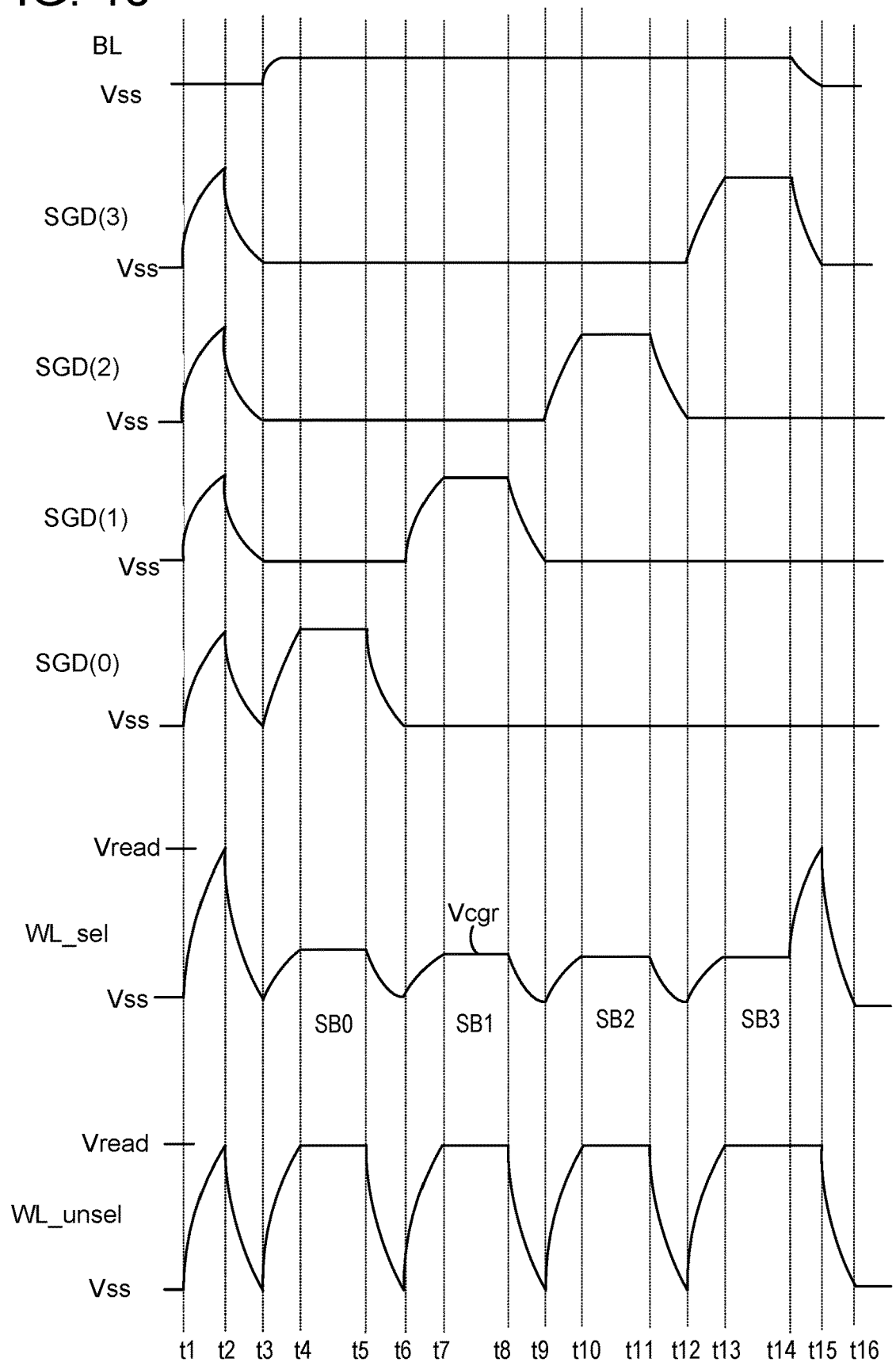
FIG. 16 depicts timing of voltages applied to word lines, select lines and bit lines during an embodiment of a read operation that is consistent with the process of FIG. 15.

FIG. 15 is a flowchart of one embodiment of a process 1500 of reading multiple groups of memory cells between a read spike and channel clean in which the voltage on the unselected word lines is brought down to a steady state voltage between reading each group of memory cells. In one embodiment, the state machine 362 controls process 1500. Process 1500 will be discussed with reference to the timing diagram in FIG. 16. FIG. 16 depicts timing of voltages applied to word lines, select lines and bit lines during an embodiment of a read operation.

Step 1502 includes applying a read spike voltage to a word lines and select lines in a block of non-volatile memory cells. With reference to FIG. 16, the voltages on the selected word line (WL_sel) and the unselected word lines (WL_unsel) are raised from a steady state voltage (Vss) at t1 to Vread by t2. Between t2 and t3 the voltage on the word lines is lowered from Vread to Vss. The voltages could be held at Vread for a brief period of time. Although the timing of voltages for dummy word lines are not depicted in FIG. 16, the voltages on the dummy word lines are the same as those of the unselected word line, in one embodiment. Step 1502 also includes applying a spike voltage to drain side select lines of the block. With reference to FIG. 16, the voltage timing for four drain side select lines is depicted. These correspond to an embodiment that is consistent with FIGS. 6-8. However, there may be more or fewer than four drain side select lines. A spike voltage is applied to the drain side select lines (SGD(0), SGD(1), SGD(2), SGD(3)) between t1 and t2. The spike voltage will turn on the drain side select transistors, such that the NAND channels are connected to the bit lines. Therefore, residual electrons in the NAND channels are removed. Note that 1502 is one embodiment of step 1102 of process 1100.

Step 1504 includes selecting a sub-block. Also, a read reference voltage is applied to a selected word line while a read pass voltage is applied to unselected word lines. Step 1504 may include raising the voltage on the selected word line from steady state voltage to a read reference voltage while raising the voltage on the unselected word lines from the steady state voltage to a read pass voltage and while raising the voltage on a select line from the steady state voltage to a select voltage. With respect to FIG. 16, the voltage on WL_sel is raised between t3 and t4 from Vss to a read reference voltage (Vcgr). The read reference voltage could be any read reference voltage. In one embodiment, it is a read reference voltage used to distinguish between the two states for SLC memory cells. In one embodiment, it is one of the read reference voltages used for MLC memory cells. In one embodiment, the bit line voltage is also raised in step 1504. In one embodiment, the bit line voltage is about 0.25V. Also with reference to FIG. 16, the voltages on the unselected word lines are raised from Vss to Vread between t3 and t4. Moreover, the voltage on the SGD(0) is raised from Vss to a select voltage between t3 and t4.

Step 1506 includes sensing a group of memory cells. For example, memory cells that are both connected to WL10 and in SB0 are sensed. With reference to FIG. 16, this sensing occurs between t4 and t5. Step 1508 includes storing the result of sensing this group. In one embodiment, the results are stored in a data latch on the memory die.

Step 1510 includes a determination of whether there is another group to sense. If there is another group to sense, the voltages on the word lines and select lines are lowered to the steady state voltage. Step 1510 includes lowering the voltage on the selected word line from the read reference voltage to the steady state voltage while lowering the voltage on the unselected word lines from the read pass voltage to the steady state voltage and while lowering the voltage on the select line from the select voltage to the steady state voltage. With reference to FIG. 6, the voltage on WL_sel is lowered from Vcgr to Vss between t5 and t5, the voltage on the WL_unsel is lowered from Vread to Vss between t5 and t6, and the voltage on SGD(0) is lowered from the select voltage to Vss between t5 and t6.

The process 1500 then continues at step 1504. Step 1504, as already described, selects a sub-block and applies a read reference voltage to the selected word line while applying a read pass voltage to unselected word lines. With reference to FIG. 16, SB1 is selected by raising the voltage on SGD(1) to the select voltage between t6 and t7 and holding it there until t8. The voltage on WL_sel is raised from Vss to Vcgr between t6 and t7, and held at Vcgr until t8. In some embodiments, the value for Vcgr is the same for each sub-block. However, a different Vcgr could be used. For example, VrA could be used for SB0 and VrD for SB1. This may be used to, for example, sense a different page for SB1 than for SB0. Also, with reference to FIG. 16, the voltage on WL_unsel is raised from Vss to Vread between t6 and t7, and held at Vread until t8.

FIG. 16 depicts reading two other sub-blocks (SB2 and SB3). Hence, the process 1500 may loop between steps 1504-1512 until there are no more groups to read. Note that steps 1504-1512 are one embodiment of step 1104 of process 1100. Although FIG. 16 only depicts reading one reference voltage for reach group, each group could be read at two or more reference voltages. For example, first all groups could be read at VrA and then all groups could be read at VrE in order to read a lower page. Note that is it not required to read in this sequence. Any sequence could be used. One possible sequence is to read at two different read reference levels for SB0, then two different read reference levels for SB1, etc.

After all groups have been read (step 1510 is no), steps 1514 and 1516 are performed. Steps 1514 and 1516 are similar to steps 1318 and 1320 of process 1300. With reference to FIG. 16, the voltage on WL_sel is raised from Vcgr to Vread between t14 and t15. Between t15 and t16 the voltages on the WL_sel and WL_unsel are lowered from Vread to Vss. Steps 1514 and 1516 are one embodiment of step 1106 of process 1100.

Figure 17:
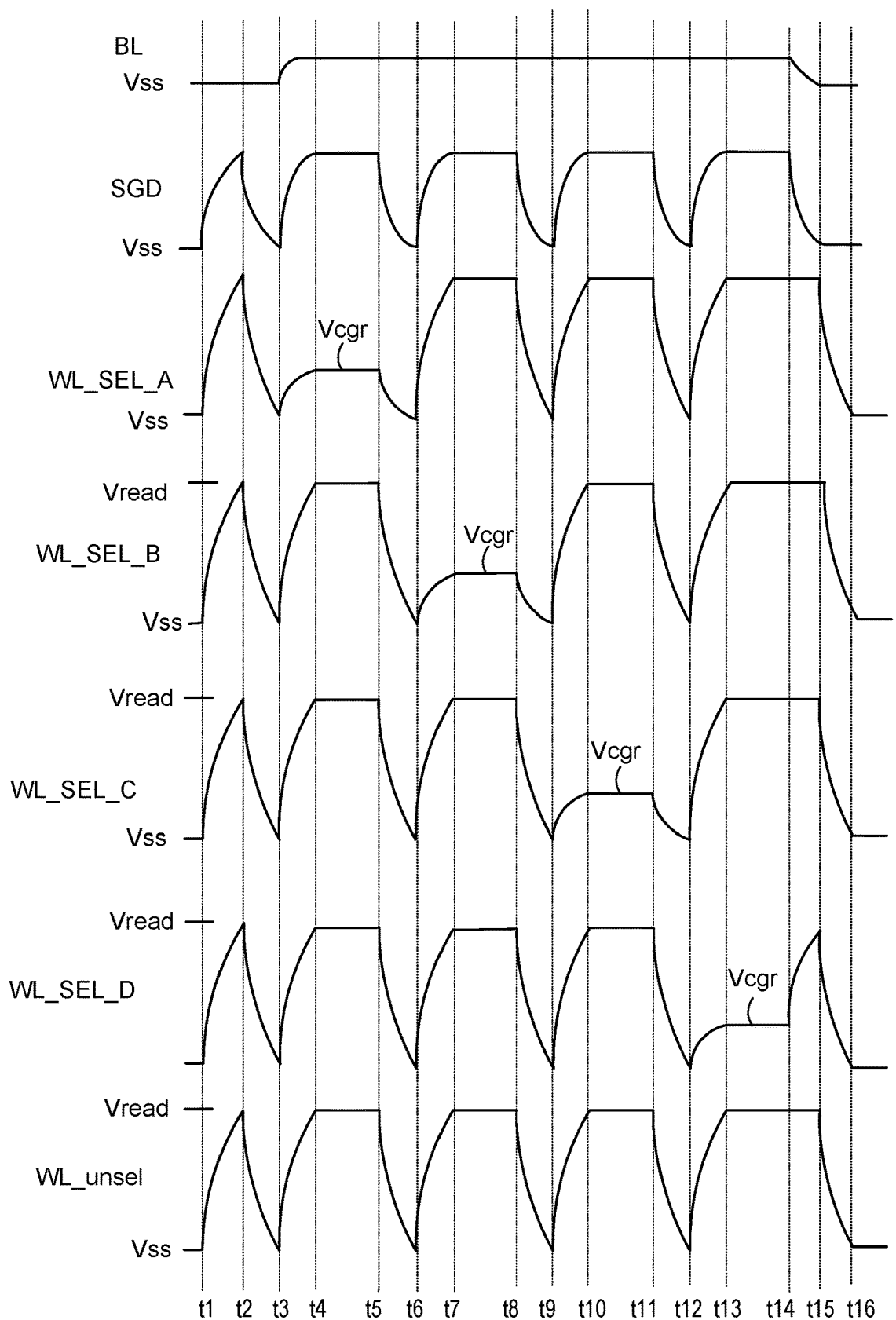
FIG. 17 depicts timing of voltages applied to word lines, a select line, and bit lines in an embodiment in which the memory cells that are read on connected to different word lines.

In one embodiment, the different groups of memory cells that are read between the read spike and channel clean include memory cells in the same block, but connected to different word lines in the block. The memory cells may be in the same sub-block or different sub-blocks. Hence, the memory cells could be selected by the same drain side select line, or drain different drain side select line. FIG. 17 depicts timing of voltages applied to word lines, a select line, and bit lines in an embodiment in which the memory cells that are read on connected to different word lines. Briefly, FIG. 17 depicts voltages on four different selected word lines (WL_SEL_A, WL_SEL_B, WL_SEL_C, and WL_SEL_D). These could be, for example, WL10, WL11, WL12, WL13 in some block of memory cells. It is not required that the word lines be adjacent to one another. In FIG. 17, the same sub-block is selected for all for cases, as is indicated by the voltage applied to SGD. With reference to the embodiment of FIG. 6, SGD could be any of SGD(0), SGD(1), SGD(2) or SGD(3). Optionally, different sub-blocks could be selected for the four different cases. If different sub-blocks are selected, the timing for the voltages on SGD(0), SGD(1), SGD(2) and SGD(3) may resemble that of FIG. 16. Also, while four selected word lines are depicted there could be more or fewer than four cases.

FIG. 17 shows that Vcgr is applied to WL_A between t4 and t5. Hence, memory cells connected to WL_SEL_A are read between t4 and t5. In an embodiment, these are the memory cells in the sub-block selected by SGD. Vcgr is applied to WL_SEL_B between t7 and t8. Hence, memory cells connected to WL_SEL_B are read between t7 and t8. Vcgr is applied to WL_SEL_C between t10 and t11. Hence, memory cells connected to WL_SEL_C are read between t10 and t11. Vcgr is applied to WL_SEL_D between t13 and t14. Hence, memory cells connected to WL_SEL_D are read between t13 and t14. Note that only one of the aforementioned word lines is a "selected word line" at one point in time. For example, when WL_SEL_A is selected for reading between t4 and t5, WL_SEL_B, WL_SEL_C, and WL_SEL_D are all unselected word lines.

The process 1500 of FIG. 15 may be adapted to read the memory cells in accordance with the timing of FIG. 17. Recall that step 1504 is to select a sub-block, as well as to apply a read reference voltage to the selected word line and a read pass voltage to the unselected word lines. Moreover, prior to step 1504, the word lines and select lines are at the steady state voltage. Hence, each time that step 1504 is performed, one option is to change what word line is selected relative to the prior iteration of step 1504. Hence, with reference to FIG. 17, step 1502 may be performed to apply the voltages between t1 and t3. The first time step 1504 is performed, the voltages between t3 and t5 are applied. The voltages on the word lines and select line are lowered in step 1512 (between t5 and t6). The second time step 1504 is performed, the voltages between t6 and t8 are applied. The voltages on the word lines and select line are lowered in step 1512 (between t8 and t9). The third time step 1504 is performed, the voltages between t9 and t11 are applied. The voltages on the word lines and select line are lowered in step 1512 (between t11 and t12. The fourth time step 1504 is performed, the voltages between t12 and t14 are applied. Step 1514 may be performed to raise the voltage on WL_SEL_D between t14 and t5. Step 1516 may be performed to lower the voltages on the selected word line (WL_SEL_D) and the unselected word line between t15a and t16.

When a host system 120 instructs the memory system 100 to program data, the host system 120 may provide a number of pages of data. In some cases, the pages are associated with a sequence of logical page addresses. Reading the memory cells in accordance with some of the embodiments described herein may read pages of data in a different order than a conventional sequences of reading pages. In some embodiments, the memory controller 102 factors in this different read order when programming the pages of data. This allows the memory controller 102 to return pages to the host system 120 in an efficient manner.

Figure 18:
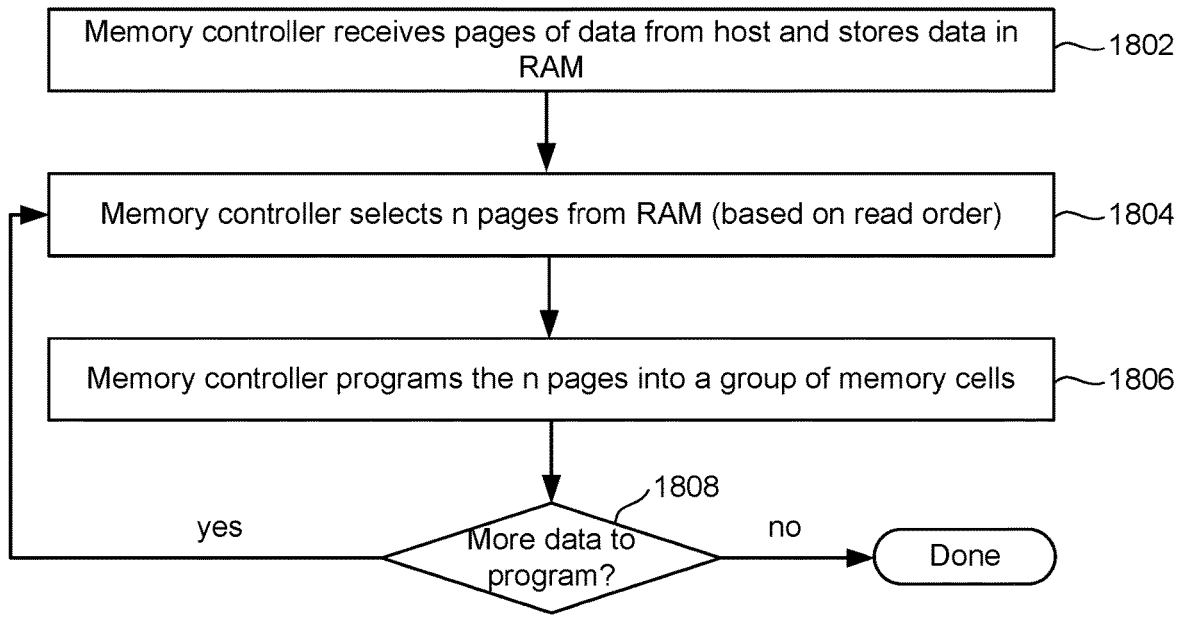
FIG. 18 is a flowchart of one embodiment of a process of programming data.

FIG. 18 is a flowchart of one embodiment of a process 1800 of programming data for MLC cells. Step 1802 includes the memory controller 102 receiving pages of data from the host system 120. The memory controller 102 stores the pages in RAM in the memory controller 102. The memory controller 102 could store the data in DRAM 106, SRAM 230/260, buffer 232/262, or another location.

In step 1804, the memory controller 102 selects n pages from the RAM. These n pages will be programmed into a page of memory cells. The number n matches the number of bits to be programmed per memory cell. In an embodiment, the n pages are not sequential in terms of logical page address. This is to account for the fact that other pages of memory cells will be read between the reading of the pages from this page of memory cells. Step 1804 may also include the memory controller 102 determining a codeword for each page of data. In some embodiments, the codeword for one page of data may depend on the data for another page of data stored into a page of memory cells. Hence, having all n pages of data that are to be programmed into a page of memory cells facilitates determining codewords.

Step 1806 includes programming the n pages into a group (e.g., page) of memory cells. In one embodiment, full sequence programming is used. In full sequence programming the memory cells are programmed directly from the erased state to the respective data states. Hence, with an embodiment of sequence programming, all n pages are programmed at the same time.

Step 1808 includes a determination of whether there is more data to program. If so, steps 1804 and 1806 are performed to program n pages into a different group of memory cells. Optionally, step 1802 could be performed again to add more data from the host system 120 into the RAM. The process ends when all data from the host system 120 is programmed.

Programming of data for SLC cells may be more straightforward than for MLC cells. This is because each page of SLC memory cells stores only one page of data.

Figure 19:
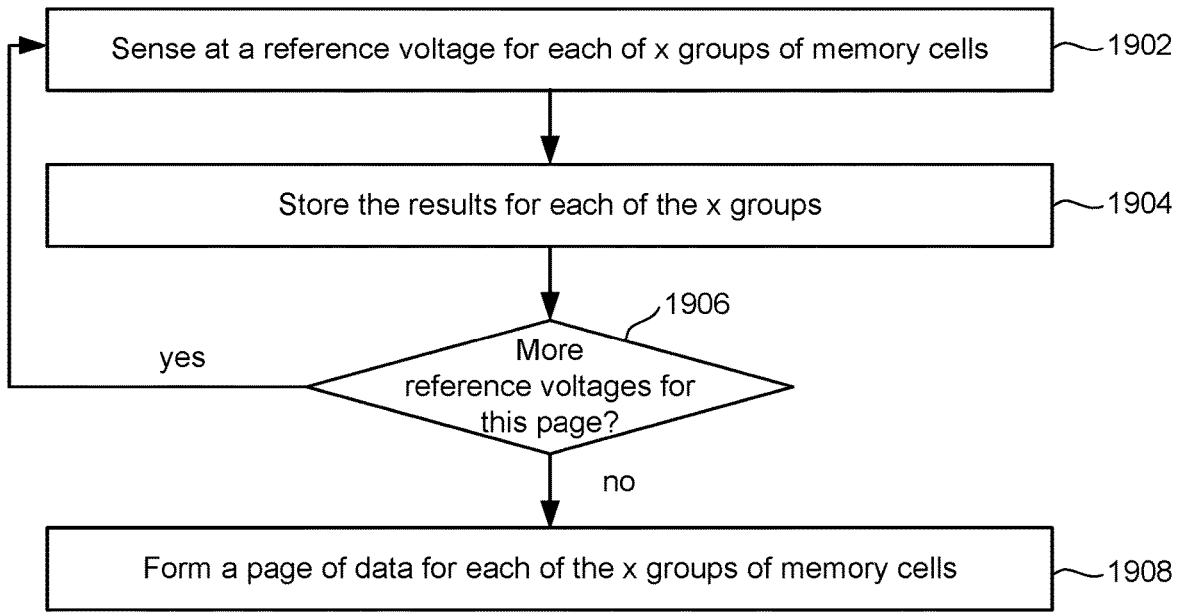
FIG. 19 is a flowchart of one embodiment of a process of reading pages of memory cells from different groups of memory cells.

FIG. 19 is a flowchart of one embodiment of a process 1900 of reading pages of memory cells from different groups of memory cells. Process 1900 describes reading a page for each group of memory cells. The process 1900 may be repeated to read a second page from each group, a third page from each group, etc. In an embodiment, process 1800 is used to program that data that is read using process 1900. In one embodiment, the state machine 362 controls process 1900. The process 1900 could be used to read SLC cells or MLC cells.

Figure 20:
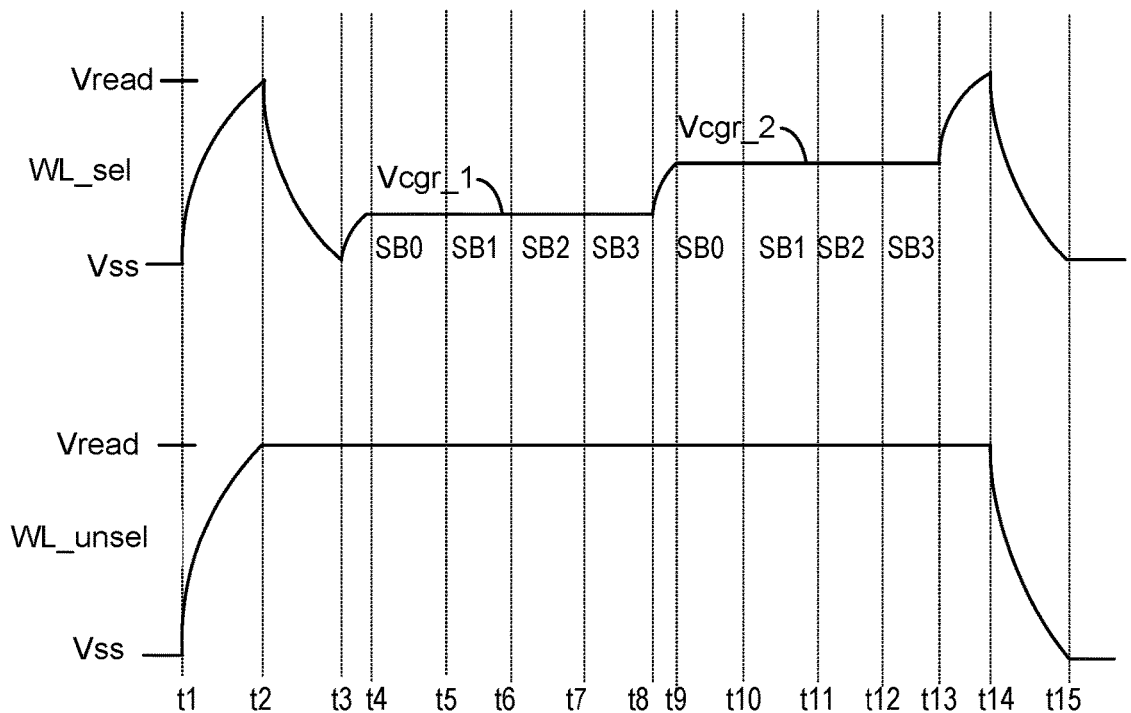
FIG. 20 shows one embodiment of timing of voltages on the selected word line (WL_sel) and the unselected word lines (WL_unsel).

Step 1902 includes sensing at a reference voltage for each of x groups of memory cells. Reference will be made to the timing diagram in FIG. 20 to illustrate one embodiment of step 1902. FIG. 20 shows one embodiment of timing of voltages on the selected word line (WL_sel) and the unselected word lines (WL_unsel). The read technique is consistent with the embodiment depicted in FIG. 14, but has two read reference voltages (Vcgr_1, Vcgr_2). The select line voltages are not depicted in FIG. 20, but may be similar to those in FIG. 14 to sense each respective sub-block. FIG. 20, shows the read spike voltage applied to WL_sel between t1 and t3. Between t4 and t8, WL_sel is at Vcgr_1. Memory cells in SB0 and connected to WL_sel are sensed at Vcgr_1 between t4 and t5. Memory cells in SB1 and connected to WL_sel are sensed at Vcgr_1 between t5 and t6. Memory cells in SB2 and connected to WL_sel are sensed at Vcgr_1 between t6 and t7. Memory cells in SB3 and connected to WL_sel are sensed at Vcgr_1 between t7 and t8.

Step 1904 of process 1900 includes storing the results of sensing each of the groups of memory cells. In one embodiment, the results are stored in latches on the memory die 300. In one embodiment, the results are stored in latches on the control die 311. In one embodiment, the latches reside in the sense amps 350. Note that step 1904 is depicted after step 1902 as a matter of convenience of explanation. The results of sensing one group may be stored prior to sensing the next group.

Step 1906 includes a determination of whether there are more reference voltages for this page. This determination may be made by the state machine 362. For example, to read a lower page of data the memory cells may need to be sensed at VrA and VrE. As noted, the process 1900 may be used to read SLC cells, in which case the memory cells are read at just one read reference voltage. If there are more reference voltages, then steps 1902 and 1904 are repeated. With reference to FIG. 20, the voltage on WL_sel is changed to the next read reference voltage (Vcgr_2). The memory cells (connected to WL_sel) in the four sub-blocks are sensed at the times depicted in FIG. 20. After the final read has been performed, the voltage on WL_sel is raised to Vread between t13 and t14. Between t13 and t14 the voltages on WL_sel and WL_unsel are lowered from Vread to Vss.

Returning again to the discussion of FIG. 19, in step 1908 a page of data is formed for each of the x groups of memory cells. For example, a lower page of data is formed for the group in SB0 based on sensing at Vcgr_1 and Vcgr_2. Likewise, a lower page of data is formed for the memory cells in the other sub-blocks (SB1, SB2, SB3). Optionally, the process 1900 may be repeated to read other pages in these groups. For example, a middle page and an upper page can be read for each group. The pages of data may then be provided to the host system 120.

FIG. 20 depicts what may be referred to as a normal order read in which the read reference voltage is increased on WL_sel as the read sequence progresses. In one embodiment, a reverse order read is used. A reverse order read means that the reference voltage is decreased on WL_sel as the read sequence progresses. For example, to read a lower page, first VrE might be applied to WL_sel (between t3 and t8 in FIG. 20), and then VrA might be applied to WL_sel (between t8 and t13 in FIG. 20).

In some embodiments, a kick voltage is used when changing the word line voltage, which can reduce the time for the word line voltage to reach the new voltage. Hence, using the kick voltage can reduce to overall time for the read sequence. The kick voltage can be a positive kick to be used when the word line voltage is to increase. An example is to use the kick voltage when increasing from Vss to Vcgr_1 in FIG. 20, or when increasing from Vcgr_1 to Vcgr_2. The kick voltage can be a negative kick to be used when the word line voltage is to decrease. An example is to use the negative kick voltage when decreasing from Vcgr2 to Vcgr_1 during a reverse order read. Further details of word line kick voltages are described in U.S. Pat. No. 9,318,210, entitled "Word Line Kick During Sensing: Trimming and Adjacent Word Lines," which is hereby incorporated by reference.

Figure 21:
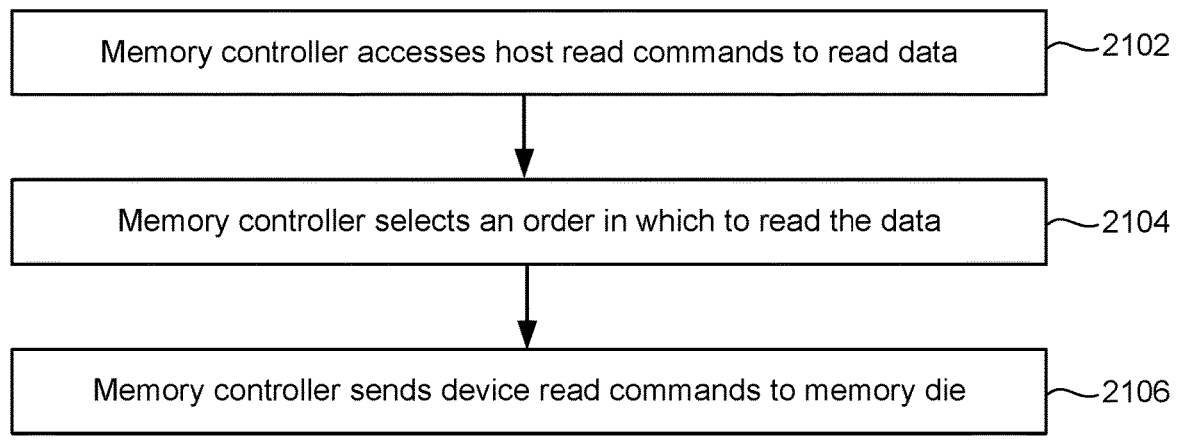
FIG. 21 is a flowchart of one embodiment of a process of a memory controller ordering the sequence of reading non-volatile memory.

In some embodiments, the memory controller 102 orders read commands in a way that is consistent with one or more of the read sequences described herein. FIG. 21 is a flowchart of one embodiment of a process 2100 of a memory controller 102 ordering the sequence of reading non-volatile memory. Step 2102 includes the memory controller 102 accessing a host read command from host system 120 to read the non-volatile memory 302. In one embodiment, the memory controller 102 accesses the host read commands from an I/O command queue such as a Non-Volatile Memory Express (NMVe) I/O submission queue. The host read commands may be, for example, NVMe read commands.

Step 2104 includes the memory controller 102 selecting an order in which to read the data. The order of reading the data may depend on the order in which the data is to be read by, for example, the state machine 362 to perform one or more of process 1100, 1300, 1500, and/or 1900. For example, with respect to the example in FIG. 20, the order may be to read a lower page on WL_sel (e.g., WL10) in each of SB0, SB1, SB2 and SB3 (of some selected block). Hence, the physical addresses for those four lower pages may be specified in the one or more device read commands. Step 2104 may include the memory controller 102 forming one or more device read commands that are to be sent to the memory die 300 or the memory structure die 301. Each device read command could specify one or more pages to read. In one embodiment, these device read commands are compliant with the Open NAND Flash Interface (ONFI) Specification.

Step 2106 includes the memory controller 102 sending one or more device read commands to the memory die 300 or the memory structure die 301. The state machine 362 processes these device read commands in order to return pages of data to the memory controller 102. Continuing with the example, the state machine 362 returns the aforementioned four lower pages. The state machine 362 could perform one or more of process 1100, 1300, 1500, and/or 1900. Note that the state machine 362 may thus perform a single read spike, followed by reading multiple pages (in different pages of memory cells), followed by a single channel clean. The memory controller 102 may apply an error detection and correction algorithm to the pages of data, and return the error corrected data to the host system 120. However, note that there may be other pages of data requested in an NVMe command from the host system 120. Hence, the memory controller 102 may sends other device read commands to obtain these other pages in order to obtain all of the data for the NVMe command. These other device read commands may also specify physical pages that are convenient to read in one of more of process 1100, 1300, 1500, and/or 1900.

In view of the foregoing, it can be seen that one embodiment includes an apparatus, comprising a control circuit configured to connect to a three-dimensional memory structure comprising blocks comprising word lines and non-volatile memory cells arranged as NAND strings. The control circuit is configured to apply a read pass voltage to word lines in a block while connecting channels of NAND strings in the block to bit lines. The control circuit is configured to lower the voltage on a selected word line from the read pass voltage to a steady state voltage. The control circuit is configured to read memory cells in different sub-blocks of the block at different times after lowering the voltage on the selected word line to the steady state voltage, including applying a read reference voltage to the selected word line while applying the read pass voltage to unselected word lines. The control circuit is configured to read the memory cells in the different sub-blocks without raising the voltage on the selected word line to the read pass voltage between reading the different sub-blocks. The control circuit is configured to raise the voltage on the selected word line to the read pass voltage after a final read of the different sub-blocks. The control circuit is configured to lower the voltage on the selected word line and unselected word lines together from the read pass voltage to a steady state voltage after the final read of the different sub-blocks.

In a second embodiment, in furtherance of the first embodiment, the control circuit is further configured to apply a select voltage to drain side select lines in the block while applying the read pass voltage to the word lines in the block to connect channels of the NAND strings in the block to bit lines to drain residual electrons from the NAND strings in the block.

In a third embodiment, in furtherance of the first or second embodiment, the control circuit is configured to: hold the selected word line at the read reference voltage between reading memory cells in the different sub-blocks at the different times; and select each group of memory cells in the block by applying a select voltage to a different drain side select line in the block.

In a fourth embodiment, in furtherance of any of the third embodiments, the control circuit is configured to: hold the unselected word lines at the read pass voltage between reading memory cells in the different sub-blocks at the different times.

In a fifth embodiment, in furtherance of any of the first to fourth embodiments, the control circuit is configured to read a page for the memory cells in each sub-block by forming a page of data for the memory cells in each sub-block based on the reads at the read reference voltage, wherein each memory cell stores a single bit.

In a sixth embodiment, in furtherance of any of the first to fifth embodiments, the control circuit is configured to read a page for the memory cells in each sub-block by: applying different read reference voltages associated with the page to the selected word line while applying the read pass voltage to the unselected word lines, wherein the memory cells in the different sub-blocks are read without raising the voltage on the selected word line to the read pass voltage between reading the different sub-blocks; and forming a page of data for the memory cells in each sub-block based on the reads at the different read reference voltages associated with the page, wherein each memory cell stores multiple bits.

In a seventh embodiment, in furtherance of any of the first to sixth embodiments, the control circuit is configured to: raise the selected word line from the read reference voltage to a second read reference voltage after reading the memory cells in the different sub-blocks; and read the memory cells in the different sub-blocks at different times after raising the voltage on the selected word line to the second read reference voltage, including applying the second read reference voltage to the selected word line while applying the read pass voltage to the unselected word lines, wherein the memory cells in the different sub-blocks are read without raising the voltage on the selected word line to the read pass voltage between reading the different sub-blocks at the second read reference voltage.

In an eighth embodiment, in furtherance of any of the first to seventh embodiments, the control circuit is configured to lower the selected word line from the read reference voltage to a second read reference voltage after reading the memory cells in the different sub-blocks. The control circuit is configured to read the memory cells in the different sub-blocks at different times after lowering the voltage on the selected word line to the second read reference voltage, including applying the second read reference voltage to the selected word line while applying the read pass voltage to the unselected word lines, wherein the memory cells in the different sub-blocks are read without raising the voltage on the selected word line to the read pass voltage between reading the different sub-blocks at the second read reference voltage.

In a ninth embodiment, in furtherance of the any of the first to eighth embodiments, control circuit is further configured to lower the voltage on the selected word line from the read reference voltage to the steady state voltage followed by raising the voltage on the selected word line up to the read reference voltage between reading each respective group of memory cells. The control circuit is configured to lower the voltage on the unselected word lines from the read pass voltage to the steady state voltage followed by raising the voltage on the unselected word lines up to the read pass voltage between reading each respective group of memory cells.

In a tenth embodiment, in furtherance of any of the ninth embodiment, the control circuit is configured to apply a kick voltage to the selected word line when raising the voltage up to the read reference voltage between reading each respective group of memory cells. The control circuit is configured to apply kick voltages to the unselected word line when raising the voltages up to the read pass voltage between reading each respective group of memory cells.

In an eleventh embodiment, in furtherance of any of the first to tenth embodiments, the control circuit is configured to lower the voltage on the selected word line from the read reference voltage to the steady state voltage followed by raising the voltage on the selected word line up to a second read reference voltage between reading each respective group of memory cells. The second read reference voltage is different than the previous read reference voltage for at least one of the groups. The control circuit is configured to lower the voltage on the unselected word lines from the read pass voltage to the steady state voltage followed by raising the voltage on the unselected word lines up to the read pass voltage between reading each respective group of memory cells.

In a twelfth embodiment, in furtherance of any of the first to eleventh embodiments, the apparatus further comprises a first semiconductor die comprising the three-dimensional memory structure. The apparatus further comprises a second semiconductor die bonded to the first semiconductor die, wherein the control circuit resides on the second semiconductor die.

One embodiment includes a method of operating non-volatile storage. The method comprises applying a read spike voltage to word lines and drain side select lines in a block of non-volatile memory cells arranged as NAND strings, including: raising the voltage on the word lines from a steady state voltage to a read pass voltage and lowering the voltage on the word lines from the read pass voltage to the steady state voltage; and raising the voltage on the drain side select lines from the steady state voltage to a select voltage and lowering the voltage on the drain side select lines from the select voltage to the steady state voltage. The method comprises sensing groups of memory cells in the block at different times after lowering the voltages on the word lines and the select lines to the steady state voltage, including: raising the voltage on a selected word line from the steady state voltage to a read reference voltage while raising the voltages on unselected word lines from the steady state voltage to a read pass voltage and while raising the voltage on a selected drain side select line in the block from the steady state voltage to the select voltage prior to the sensing of each group; sensing a selected group of the memory cells while the selected word line is at the read reference voltage, the unselected word lines are at the read pass voltage, and the selected drain side select line is at the select voltage; and lowering the voltage on the selected word line from the read reference voltage to the steady state voltage while lowering the voltage on the unselected word lines from the read pass voltage to the steady state voltage and while lowering the voltage on the selected drain side select line from the select voltage to the steady state voltage after each read but a final read. The method comprises raising the voltage on the selected word line to the read pass voltage after the final read. The method comprises lowering the voltages on the selected word line and the unselected word lines from the read pass voltage to the steady state voltage in unison after the final read.

One embodiment includes a non-volatile storage system, comprising a three-dimensional memory array comprising non-volatile memory cells arranged as NAND strings. each NAND string having a select transistor. The three-dimensional memory array comprises sets of word lines, each set of word lines connected to a set of the NAND strings. The three-dimensional memory array comprises select lines, each select line connected the select transistors of a sub-set of NAND strings that are connected to a set of the word lines. The non-volatile storage system comprises a control circuit in communication with the three-dimensional memory array. The control circuit cleans residual electrons from channels of a first set of NAND strings connected to a first set of the word lines. The control circuit, after cleaning the residual electrons from NAND channels, raises a voltage on a selected word line in the first set of the word lines from a steady state voltage to a first read reference voltage and holds the voltage on the selected word line at the first read reference voltage. The control circuit senses multiple groups of memory cells connected to the selected word line at different times while the selected word line is held at the first read reference voltage and while unselected word lines in the first set of the word lines are at a read pass voltage, including selecting each group of memory cells with a different select line connected to the first set of NAND strings. The control circuit raises the voltage on the selected word line to the read pass voltage after a final read of the multiple groups of memory cells. The control circuit lowers the voltages on the selected word line and the unselected word lines from the read pass voltage to the steady state voltage in unison.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:
1. An apparatus, comprising:
a control circuit configured to connect to a three-dimensional memory structure comprising blocks, each block comprising word lines, select lines, and non-volatile memory cells arranged as NAND strings, each block comprising sub-blocks that share the same word lines, wherein the sub-blocks of a block are selectable by different select lines, the control circuit configured to:
apply a read pass voltage to word lines in a block while connecting channels of NAND strings in the block to bit lines;
lower a voltage on a selected word line from the read pass voltage to a steady state voltage;
read memory cells in different sub-blocks of the block at different times after lowering the voltage on the selected word line to the steady state voltage, including applying a read reference voltage to the selected word line while applying the read pass voltage to unselected word lines and applying a select voltage to the select lines of the block to select the different sub-blocks at the different times, wherein the memory cells in the different sub-blocks are read without raising the voltage on the selected word line to the read pass voltage between reading the different sub-blocks;

raise the voltage on the selected word line to the read pass voltage after a final read of the different sub-blocks; and lower the voltage on the selected word line and the unselected word lines together from the read pass voltage to a steady state voltage after the final read of the different sub-blocks.

2. The apparatus of claim 1, wherein the control circuit is further configured to:

apply a select voltage to the select lines in the block while applying the read pass voltage to the word lines in the block to connect the channels of the NAND strings in the block to the bit lines to drain residual electrons from the NAND strings in the block.

3. The apparatus of claim 1, wherein the control circuit is configured to:

hold the selected word line at the read reference voltage between reading memory cells in the different sub-blocks at the different times; and the select lines of the block to which the select voltage is applied to select the different sub-blocks comprise drain side select lines in the block.

4. The apparatus of claim 3, wherein the control circuit is configured to:

hold the unselected word lines at the read pass voltage between reading memory cells in the different sub-blocks at the different times.

5. The apparatus of claim 1, wherein the control circuit is configured to read a page for the memory cells in each sub-block by:

forming a page of data for the memory cells in each sub-block based on the reads at the read reference voltage, wherein each memory cell stores a single bit.

6. The apparatus of claim 1, wherein the control circuit is configured to read a page for the memory cells in each sub-block by:

applying different read reference voltages associated with the page to the selected word line while applying the read pass voltage to the unselected word lines, wherein the memory cells in the different sub-blocks are read without raising the voltage on the selected word line to the read pass voltage between reading the different sub-blocks; and forming a page of data for the memory cells in each sub-block based on the reads at the different read reference voltages associated with the page, wherein each memory cell stores multiple bits.

7. The apparatus of claim 1, wherein the control circuit is configured to:

raise the selected word line from the read reference voltage to a second read reference voltage after reading the memory cells in the different sub-blocks; and read the memory cells in the different sub-blocks at different times after raising the voltage on the selected word line to the second read reference voltage, including applying the second read reference voltage to the selected word line while applying the read pass voltage to the unselected word lines, wherein the memory cells in the different sub-blocks are read without raising the voltage on the selected word line to the read pass voltage between reading the different sub-blocks at the second read reference voltage.

8. The apparatus of claim 1, wherein the control circuit is configured to:

lower the selected word line from the read reference voltage to a second read reference voltage after reading the memory cells in the different sub-blocks; and read the memory cells in the different sub-blocks at different times after lowering the voltage on the selected word line to the second read reference voltage, including applying the second read reference voltage to the selected word line while applying the read pass voltage to the unselected word lines, wherein the memory cells in the different sub-blocks are read without raising the voltage on the selected word line to the read pass voltage between reading the different sub-blocks at the second read reference voltage.

9. The apparatus of claim 1, wherein the control circuit is further configured to:

lower the voltage on the selected word line from the read reference voltage to the steady state voltage followed by raising the voltage on the selected word line up to the read reference voltage between reading each respective group of memory cells; and lower the voltage on the unselected word lines from the read pass voltage to the steady state voltage followed by raising the voltage on the unselected word lines up to the read pass voltage between reading each respective group of memory cells.

10. The apparatus of claim 9, wherein the control circuit is configured to:

apply a kick voltage to the selected word line when raising the voltage up to the read reference voltage between reading each respective group of memory cells; and apply kick voltages to the unselected word line when raising the voltages up to the read pass voltage between reading each respective group of memory cells.

11. The apparatus of claim 1, wherein the control circuit is configured to:

lower the voltage on the selected word line from the read reference voltage to the steady state voltage followed by raising the voltage on the selected word line up to a second read reference voltage between reading each respective group of memory cells, wherein the second read reference voltage is different than a previous read reference voltage for at least one of the groups; and lower the voltage on the unselected word lines from the read pass voltage to the steady state voltage followed by raising the voltage on the unselected word lines up to the read pass voltage between reading each respective group of memory cells.

12. The apparatus of claim 1, further comprising:

a first semiconductor die comprising the three-dimensional memory structure; and a second semiconductor die bonded to the first semiconductor die, wherein the control circuit resides on the second semiconductor die.

13. A method of operating non-volatile storage, the method comprising:

applying a read spike voltage to word lines and drain side select lines in a block of non-volatile memory cells arranged as NAND strings, including:

raising a voltage on the word lines from a steady state voltage to a read pass voltage and lowering the voltage on the word lines from the read pass voltage to the steady state voltage; and raising a voltage on the drain side select lines from the steady state voltage to a select voltage and lowering the voltage on the drain side select lines from the select voltage to the steady state voltage;

sensing groups of memory cells in the block at different times after lowering the voltages on the word lines and the select lines to the steady state voltage, including:

raising a voltage on a selected word line from the steady state voltage to a read reference voltage while raising voltages on unselected word lines from the steady state voltage to a read pass voltage and while raising a voltage on a selected drain side select line in the block from the steady state voltage to the select voltage prior to the sensing of each group;

sensing a selected group of the memory cells while the selected word line is at the read reference voltage, the unselected word lines are at the read pass voltage, and the selected drain side select line is at the select voltage; and lowering the voltage on the selected word line from the read reference voltage to the steady state voltage while lowering the voltage on the unselected word lines from the read pass voltage to the steady state voltage and while lowering the voltage on the selected drain side select line from the select voltage to the steady state voltage after each read but a final read;

raising the voltage on the selected word line to the read pass voltage after the final read; and lowering the voltages on the selected word line and the unselected word lines from the read pass voltage to the steady state voltage in unison after the final read.

14. The method of claim 13, wherein raising the voltage on a selected drain side select line in the block from the steady state voltage to the select voltage prior to a read of each selected group comprises:

raising the voltage on a different drain side select line prior to the read of each selected group, wherein the groups of memory cells reside in different sub-blocks of the block.

15. The method of claim 13, wherein raising the voltage on a selected word line from the steady state voltage to the read reference voltage prior to the sensing of each selected group comprises:

raising the voltage on a different selected word line prior to the sensing of each selected group, wherein the groups of memory cells are connected to different word lines of the block.

16. The method of claim 13, wherein raising the voltage on a selected word line from the steady state voltage to a read reference voltage prior to the sensing of each selected group comprises:

raising the voltage on the selected word line to a different read reference voltage for at least two of the groups of memory cells, wherein at least two of the groups of memory cells are read at different read reference voltages.

17. A non-volatile storage system, comprising:

a three-dimensional memory array comprising non-volatile memory cells arranged as NAND strings, each NAND string having a select transistor, the three-dimensional memory array comprising sets of word lines, each set of word lines connected to a set of the NAND strings, the three-dimensional memory array comprising select lines, each select line connected the select transistors of a sub-set of NAND strings that are connected to a set of the word lines, wherein the three-dimensional memory array comprises bit lines; and a control circuit in communication with the three-dimensional memory array, wherein the control circuit:

applies first voltages to a first set of the word lines and second voltages to a plurality of select lines connected to a corresponding plurality of sets of the NAND strings, the first voltages turn on memory cells on the plurality of sets of NAND strings, the second voltages turn on select transistors of the plurality of sets of NAND strings;

after applying the first and the second voltages, raises a voltage on a selected word line in the first set of the word lines from a steady state voltage to a first read reference voltage and holds the voltage on the selected word line at the first read reference voltage;

senses multiple groups of memory cells connected to the selected word line at different times while the selected word line is held at the first read reference voltage and while unselected word lines in the first set of the word lines are at a read pass voltage, wherein each group of memory cells resides on a different set of the plurality of sets of NAND strings, including selecting each group of memory cells with a different select line of the plurality of select lines;

raises the voltage on the selected word line to the read pass voltage after a final read of the multiple groups of memory cells; and lowers the voltages on the selected word line and the unselected word lines from the read pass voltage to the steady state voltage in unison.

18. The non-volatile storage system of claim 17, wherein the control circuit reads a page for each of the multiple groups of memory cells by:

i) changing the voltage on the selected word line from the first read reference voltage to a second read reference voltage and holding the voltage on the selected word line at the second read reference voltage;

ii) sensing the multiple groups of memory cells connected to the selected word line at different times while the selected word line is held at the second read reference voltage and while the unselected word lines are at the read pass voltage, including selecting each group of memory cells with a different select line of the plurality of select lines; and iii) repeating i) and ii) for any additional read reference voltages associated with the page until the multiple groups are sensed at all read reference voltages associated with the page.

19. The non-volatile storage system of claim 18, wherein the control circuit:

forms a page of data for each group of memory cells from reading each respective group at all of the read reference voltages associated with the page; and provides the page of data for each group to a host system.

* * * * *